United States Patent
Naito

(10) Patent No.: US 11,201,208 B2
(45) Date of Patent: Dec. 14, 2021

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 119 days.

(21) Appl. No.: 16/261,215

(22) Filed: Jan. 29, 2019

(65) Prior Publication Data

US 2019/0157381 A1 May 23, 2019

Related U.S. Application Data

(63) Continuation of application No. PCT/JP2018/004932, filed on Feb. 13, 2018.

(30) Foreign Application Priority Data

Feb. 13, 2017 (JP) .............................. JP2017-024112
May 1, 2017 (JP) .............................. JP2017-091473

(51) Int. Cl.
*H01L 29/06* (2006.01)
*H01L 29/40* (2006.01)
(Continued)

(52) U.S. Cl.
CPC ........ *H01L 29/063* (2013.01); *H01L 29/0623* (2013.01); *H01L 29/0696* (2013.01);
(Continued)

(58) Field of Classification Search
CPC ........ H01L 29/739; H01L 29/78; H01L 21/30
See application file for complete search history.

(56) References Cited

U.S. PATENT DOCUMENTS

| 5,894,149 A | 4/1999 | Uenishi |
| 10,290,073 B2 | 5/2019 | Nakano |

(Continued)

FOREIGN PATENT DOCUMENTS

| CN | 101675525 A | 3/2010 |
| CN | 101981701 A | 2/2011 |

(Continued)

OTHER PUBLICATIONS

Office Action issued for counterpart Japanese Application No. 2018-567544, issued by the Japanese Patent Office dated Dec. 24, 2019 (drafted on Dec. 16, 2019).

(Continued)

*Primary Examiner* — Seahvosh Nikmanesh

(57) ABSTRACT

A semiconductor device is provided including: a semiconductor substrate having a first-conductivity-type drift region; a second-conductivity-type base region provided above the drift region inside the semiconductor substrate; an accumulation region provided between the drift region and the lower surface of the base region inside the semiconductor substrate, and having a lower second-conductivity-type carrier mobility than the drift region and the base region; a gate trench portion provided from an upper surface of the semiconductor substrate to an inside of the semiconductor substrate, where the gate trench portion is in contact with the base region; and a carrier passage region occupying at least a partial region between the accumulation region and the gate trench portion inside the semiconductor substrate, where the carrier passage region has a higher second-conductivity-type carrier mobility than the accumulation region.

16 Claims, 29 Drawing Sheets

(51) Int. Cl.
*H01L 29/10* (2006.01)
*H01L 29/739* (2006.01)
*H01L 29/08* (2006.01)
*H01L 29/423* (2006.01)
*H01L 29/861* (2006.01)

(52) U.S. Cl.
CPC ...... *H01L 29/0834* (2013.01); *H01L 29/1095* (2013.01); *H01L 29/407* (2013.01); *H01L 29/4238* (2013.01); *H01L 29/42376* (2013.01); *H01L 29/7397* (2013.01); *H01L 29/8613* (2013.01)

(56) References Cited

U.S. PATENT DOCUMENTS

| | | |
|---|---|---|
| 2005/0263853 A1 | 12/2005 | Tomomatsu |
| 2007/0267663 A1 | 11/2007 | Harada |
| 2008/0197379 A1 | 8/2008 | Shinji |
| 2010/0289076 A1 | 11/2010 | Nishida |
| 2010/0327313 A1 | 12/2010 | Nakamura |
| 2011/0204439 A1 | 8/2011 | Kawaguchi |
| 2012/0146091 A1 | 6/2012 | Tanabe |
| 2014/0138736 A1 | 5/2014 | Park |
| 2014/0138738 A1 | 5/2014 | Sato |
| 2015/0349103 A1* | 12/2015 | Onozawa ............ H01L 29/0696 257/144 |
| 2017/0012109 A1 | 1/2017 | Akagi |
| 2017/0040423 A1 | 2/2017 | Inoue |
| 2018/0108737 A1* | 4/2018 | Naito ................. H01L 29/1087 |

FOREIGN PATENT DOCUMENTS

| | | |
|---|---|---|
| CN | 105047705 A | 11/2015 |
| JP | H09331063 A | 12/1997 |
| JP | 2005347289 A | 12/2005 |
| JP | 2007311627 A | 11/2007 |
| JP | 2008078397 A | 4/2008 |
| JP | 2008205015 A | 9/2008 |
| JP | 2009152465 A | 7/2009 |
| JP | 2011176077 A | 9/2011 |
| JP | 2013120809 A | 6/2013 |
| JP | 2013222798 A | 10/2013 |
| JP | 2014007254 A | 1/2014 |
| JP | 2014103352 A | 6/2014 |
| JP | 2014197702 A | 10/2014 |
| WO | 2009122486 A1 | 10/2009 |
| WO | 2015111387 A1 | 7/2015 |
| WO | 2016006696 A1 | 1/2016 |

OTHER PUBLICATIONS

International Search Report for International Patent Application No. PCT/JP2018/004932, issued by the Japan Patent Office dated Apr. 24, 2018.

Notice of First Office Action for Patent Application No. 201880003079.X, issued by The National Intellectual Property Administration of the People's Republic of China dated Jun. 22, 2021.

* cited by examiner

SEMICONDUCTOR DEVICE

The contents of the following Japanese patent application(s) are incorporated herein by reference:
NO. 2017-024112 filed in JP on Feb. 13, 2017,
NO. 2017-091473 filed in JP on May 1, 2017, and
PCT/JP2018/004932 filed on Feb. 13, 2018.

BACKGROUND

1. Technical Field

The present invention relates to a semiconductor device.

2. Related Art

Conventionally, a semiconductor device including, for example, an IGBT (Insulated Gate Bipolar Transistor) is known to have such a structure that an N type accumulation region having a high doping concentration is provided between a P type base region and an N type drift region (see Patent Document 1, for example).
Patent document 1: Japanese Patent Application Publication No. 2005-347289

The existence of the accumulation region causes holes to be accumulated below the accumulation region. For this reason, the on-voltage of the semiconductor device can be reduced. However, if the carrier accumulation effect becomes too high, it becomes difficult to extract the holes toward the emitter side at the time of turn-off or the like. For this reason, the turn-off loss may increase, for example.

SUMMARY

One aspect of the present invention provides a semiconductor device comprising a semiconductor substrate having a first-conductivity-type drift region. The semiconductor substrate may have a second-conductivity-type base region provided above the drift region. The semiconductor substrate may have an accumulation region provided between the drift region and a lower surface of the base region. The accumulation region may have a lower second-conductivity-type carrier mobility than the drift region and the base region. The semiconductor substrate may have a gate trench portion provided from an upper surface of the semiconductor substrate to an inside of the semiconductor substrate. The gate trench portion may be in contact with the base region. The semiconductor substrate may have a carrier passage region occupying at least a partial region between the accumulation region and the gate trench portion. The carrier passage region may have a higher second-conductivity-type carrier mobility than the accumulation region.

The accumulation region may be a first-conductivity-type region having a higher doping concentration than the drift region. The accumulation region may include at least one type of high resistance region selected from among an oxide region, a nitride region and a carbide region. The carrier passage region may be a part of the drift region.

The accumulation region may be provided to overlap the entire base region. The accumulation region may additionally overlap a part of a lower surface of the gate trench portion.

The semiconductor substrate may include a dummy trench portion provided from the upper surface of the semiconductor substrate to the inside of the semiconductor substrate. The dummy trench portion may be in contact with the base region. No carrier passage region may be provided between the dummy trench portion and the accumulation region. The accumulation region may be provided below the lower end of the gate trench portion. The base region in direct contact with the dummy trench portion may extend deeper than the base region in direct contact with the gate trench portion, relative to the upper surface of the semiconductor substrate.

The dummy trench portion may have a dummy insulating film formed on a trench inner wall and a dummy conductive portion surrounded by the dummy insulating film. At least a part of the bottom portion of the dummy trench portion may not have the dummy insulating film formed thereon. The dummy conductive portion may be in contact with the semiconductor substrate at the bottom portion of the dummy trench portion.

The gate trench portion may be provided along a predetermined linear direction at the upper surface of the semiconductor substrate. The semiconductor substrate may include a first-conductivity-type emitter region formed above the base region and having a higher doping concentration than the drift region. The semiconductor substrate may include a second-conductivity-type contact region formed above the base region and having a higher doping concentration than the base region. The emitter region and the contact region may be exposed alternately at the upper surface of the semiconductor substrate along the linear direction. The carrier passage region may be also provided below the emitter region. The carrier passage region may be also provided below the contact region.

The gate trench portion may have an upper portion in direct contact with the upper surface of the semiconductor substrate and a lower portion provided under the upper portion and narrower than the upper portion. The base region may be in direct contact with the upper portion. The accumulation region may be provided at a position facing the lower portion. The carrier passage region may be provided between the accumulation region and the lower portion.

The semiconductor device may include a transistor portion provided in the semiconductor substrate and having a second-conductivity-type collector region in a region in direct contact with a lower surface of the semiconductor substrate. The semiconductor device may include a diode portion provided in the semiconductor substrate, and having a first-conductivity-type cathode region in a region in direct contact with the lower surface of the semiconductor substrate. The transistor portion may have the drift region, the base region, the accumulation region, the gate trench portion and the carrier passage region. The diode portion may have the drift region, the base region and a dummy trench portion provided from the upper surface of the semiconductor substrate to the inside of the semiconductor substrate. In the diode portion, no accumulation region may be provided between the base region and the drift region.

The accumulation region may be separated from the base region in the depth direction of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, embodiments of the present invention will be described. The following embodiments do not limit the invention according to the claims, and all the combinations of the features described in the embodiments are not necessarily essential to means provided by aspects of the invention.

As used herein, one side in a direction parallel to a depth direction of a semiconductor substrate is referred to as "upper," and the other side is referred to as "lower." One surface in two principal surfaces of a substrate, a layer or another member is referred to as upper surface, and the other surface is referred to as lower surface. The "upper" and "lower" directions are not limited to a gravity direction, or a mounting direction of a of a semiconductor device to a board and so on in mounting thereof. As used herein, there are cases that a technical matter may be described with orthogonal coordinate axes of X-axis, Y-axis and Z-axis. A depth direction of the semiconductor substrate is defined as the Z-axis.

As used herein, though terms "emitter" and "collector" are used, the semiconductor device is not limited to the IGBT. Terms "source" and "drain" in a transistor such as a MOSFET can also be included in scopes of the terms of the "emitter" and the "collector" as used herein.

In each embodiment, there is shown the example in which the first conductivity type is N type, and the second conductivity type is P type; however, the first conductivity type may be P type, and the second conductivity type may be N type. In this case, the conductivity types of the substrate, layers, regions, and so on in each embodiment are reversed.

As used herein, a doping concentration refers to a concentration of impurities transformed to donors or acceptors. As used herein, there are cases that a difference of concentration of the donors and acceptors is defined as the doping concentration (referred to as net doping concentration or carrier concentration). Also, there are cases that the peak value of the doping concentration distribution in the doping region is defined as the doping concentration in the doping region.

Figure 1:
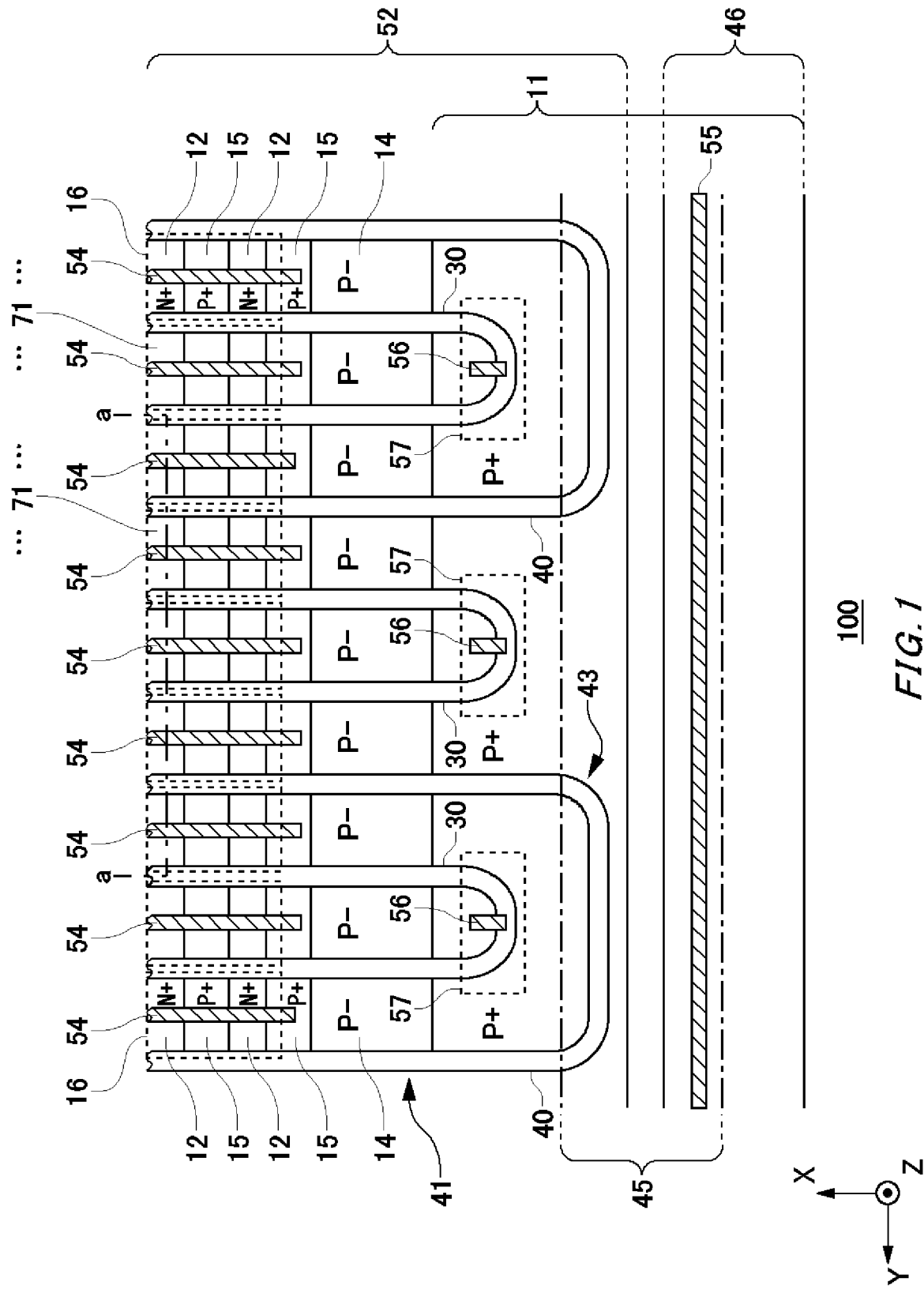
FIG. 1 shows a part of an upper surface of a semiconductor device 100 according to an embodiment in the present invention.

FIG. 1 shows a part of an upper surface of a semiconductor device 100 according to an embodiment of the present invention. The semiconductor device 100 of the present example is a semiconductor chip including a transistor such as the IGBT or the like. In FIG. 1, a chip upper surface is shown around a chip end portion, and other regions are omitted.

Although FIG. 1 shows the active region of the semiconductor substrate in the semiconductor device 100, the semiconductor device 100 may have an edge termination structure section surrounding the active region. The active region refers to a region in which a current flows when the semiconductor device 100 is turned on. The edge termination structure section relaxes electric field concentration on the upper surface side of the semiconductor substrate. The edge termination structure section includes, for example, a guard ring, a field plate, a RESURF, and a combination thereof.

The semiconductor device 100 of the present example comprises a gate trench portion 40, a dummy trench portion 30, an emitter region 12, a base region 14, a contact region 15, an accumulation region 16 and a well region 11 that are formed inside the semiconductor substrate. The accumulation region 16 is not exposed to the upper surface of the semiconductor substrate. In FIG. 1, a region in which the accumulation region 16 is formed in an XY plane parallel to the upper surface of the semiconductor substrate is denoted by a dashed line. In the present example, the plurality of accumulation regions 16 that are isolated from each other in the plane are provided. Also, the semiconductor device 100 of the present example comprises an emitter electrode 52 and a gate metal layer 46 provided above the upper surface of the semiconductor substrate. The emitter electrode 52 and the gate metal layer 46 are provided isolated from each other.

Though an interlayer dielectric film is formed between the emitter electrode 52 and the gate metal layer 46, and the upper surface of the semiconductor substrate, it is omitted in FIG. 1. In the interlayer dielectric film of the present example, a contact hole 54, a contact hole 55 and a contact hole 56 are formed to pass through the interlayer dielectric film.

The emitter electrode 52 is in contact with the emitter region 12, the contact region 15 and the base region 14 at the upper surface of the semiconductor substrate via the contact hole 54. The contact hole 54 of the present example is formed between individual trench portions. Also, the emitter electrode 52 is connected to a dummy conductive portion inside the dummy trench portion 30 via the contact hole 56. A connection portion 57 formed of a conductive material such as polysilicon doped with impurities may be provided between the emitter electrode 52 and the dummy conductive portion. The connection portion 57 is formed on the upper surface of the semiconductor substrate across the insulating film such as a thermal oxide film. In the present example, the contact hole 56 is arranged at the edge portion of the dummy trench portion 30 in the X-axis direction.

The gate metal layer 46 is in contact with the gate runner 45 via the contact hole 55. The gate runner 45 is formed of polysilicon doped with impurities. The insulating film such as thermal oxide film is formed between the gate runner 45 and the semiconductor substrate. The gate runner 45 is connected to a gate conductive portion inside the gate trench portion 40 at the upper surface of the semiconductor substrate. The gate runner 45 is not connected to the dummy conductive portion inside the dummy trench portion 30. The gate runner 45 of the present example is formed from below the contact hole 55 to an edge portion 43 of the gate trench portion 40. In the edge portion 43 of the gate trench portion 40, the gate conductive portion is exposed to the upper surface of the semiconductor substrate to be in contact with the gate runner 45.

The emitter electrode 52 and the gate metal layer 46 are formed of a material including a metal. For example, at least a partial region of each electrode is formed of aluminum or an aluminum-silicon alloy. Each electrode may have a barrier metal formed of, for example, titanium or a titanium compound in a lower layer of the region formed of, for example, aluminum. Further, a plug formed by embedding of, for example, tungsten may be provided inside the contact hole to be in contact with the barrier metal and aluminum and so on.

One or more gate trench portions 40 and one or more dummy trench portions 30 are arrayed at predetermined intervals at the upper surface of the semiconductor substrate along a predetermined array direction (short direction). The array direction in FIG. 1 is the Y-axis direction.

The gate trench portion 40 of the present example may have two extension portions 41 (part of the trench that is linear along an extending direction) that extends in a linear shape along a extending direction that is parallel to the upper surface of the semiconductor substrate and perpendicular to the array direction (longitudinal direction, X-axis direction in the present example) and the edge portion 43 that connects between the two extension portions 41, at the edge of the extension portion 41. At least a part of the edge portion 43 is preferably formed in a curved line at the upper surface of the semiconductor substrate. When the edges of the two extension portions 41 in the gate trench portion 40 are connected, an electric field concentration at the end portions of the extension portion 41 can be relaxed.

One or more dummy trench portions 30 are provided between the individual extension portions 41 of the gate trench portion 40. Similarly to the gate trench portion 40, the dummy trench portion 30 may have an edge portion that connects between the edges of the two extension portions. In the present example, the dummy trench portion 30 having the two extension portions and edge portions is formed between the individual extension portions 41 of the gate trench portion 40. The dummy trench portion 30 of another example may have a linear shape without the edge portion. The dummy trench portion 30 is positioned so as not to overlap the gate runner 45.

The emitter electrode 52 is formed above the gate trench portion 40, the dummy trench portion 30, the well region 11, the emitter region 12, the base region 14 and the contact region 15. The well region 11 is formed in a predetermined range to be separated from a longitudinal end of the contact hole 54 in an active region on a side in which the gate metal layer 46 is provided. The well region 11 is of the second conductivity type, and may have a deeper diffusion depth than the depths of the gate trench portion 40 and the dummy trench portion 30. A partial region of the gate trench portion 40 and the dummy trench portion 30 on a gate metal layer 46 side is formed in the well region 11. The bottoms of the end and edge portion of the dummy trench portion 30 in the extending direction may be covered with the well region 11.

The base region 14 is formed in a mesa portion 71 sandwiched by the individual trench portions. In a region of the semiconductor substrate sandwiched by the trench portions, the mesa portion 71 is a region on an upper surface side than the deepest bottom section of the trench portion. The well region 11 is of the second conductivity type. The base region 14 is a P− type region having a lower doping concentration than the well region 11, and the well region 11 is of P+ type.

The P+ type contact region 15 having a higher doping concentration than the base region 14 is formed on the upper surface of the base region 14 in the mesa portion 71. The well region 11 may extend, toward the gate metal layer 46, from the last one of the contact regions 15 that are arranged in the active region next to each other in the extending direction of the trench portions. Also, the emitter region 12 of N+ type having a higher doping concentration than the semiconductor substrate is selectively formed on the upper surface of the base region 14.

Each of the contact region 15 and the emitter region 12 is formed from one of the adjacent trench portions to the other. The contact region 15 and the emitter region 12 are formed to be exposed to the upper surface of the semiconductor substrate alternately along the extending direction (X-axis direction) of the trench portion. Each of the contact region 15 and the emitter region 12 may be in contact with one or the other of the adjacent trench portions over a predetermined length along the extending direction of each trench portion.

In the mesa portion 71 of another example, the contact region 15 and the emitter region 12 may be formed in a stripe shape along the extending direction. For example, the emitter region 12 is formed in a region in direct contact with the trench portion, and the contact region 15 is formed in a region sandwiched by the emitter region 12.

The contact hole 54 is formed above each region of the contact region 15 and emitter region 12. The contact hole 54 is not formed in a region corresponding to the base region 14 and the well region 11.

Figure 2A:
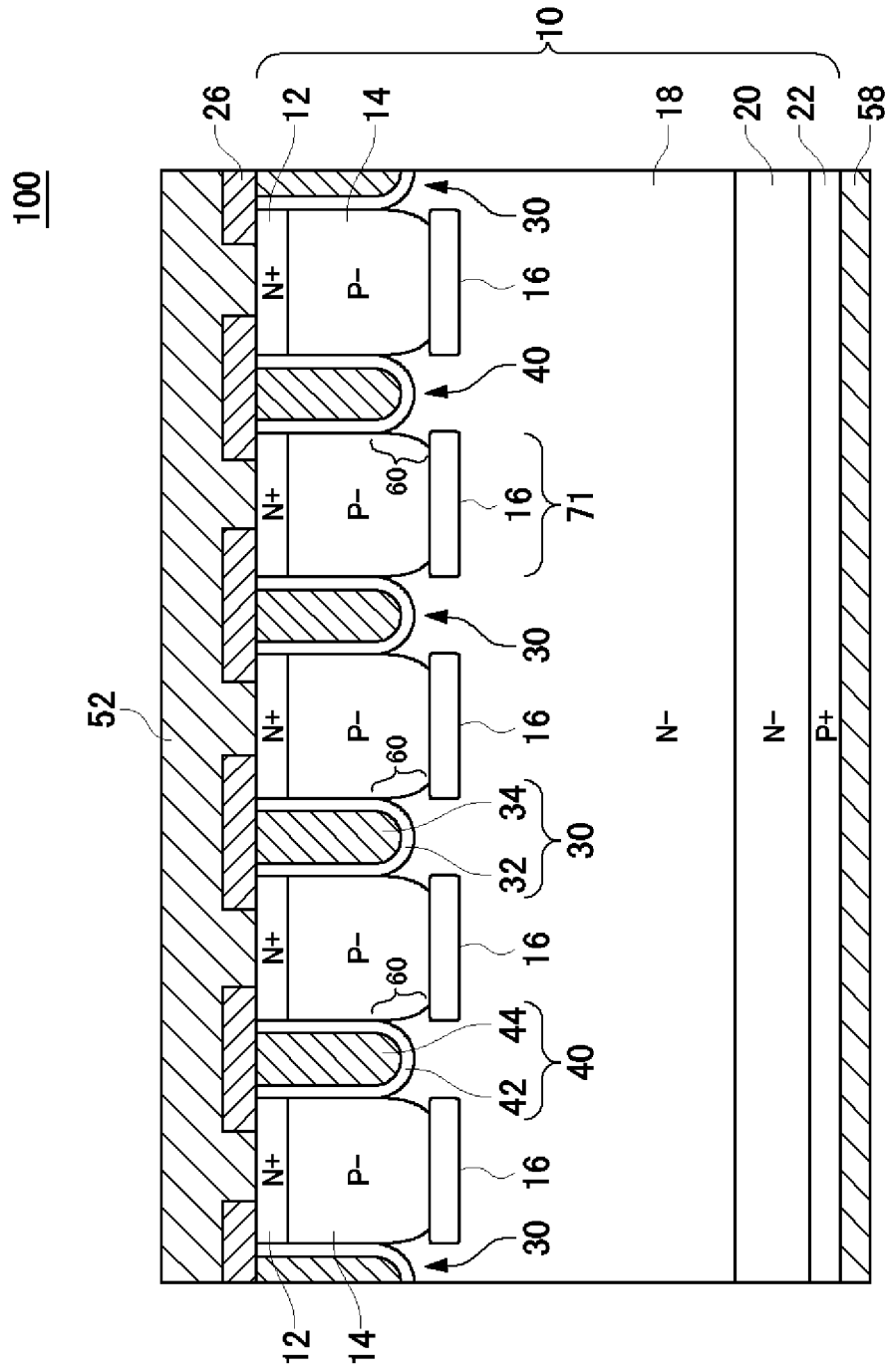
FIG. 2A shows one example in a cross-section a-a in FIG. 1.

FIG. 2A shows one example in a cross-section a-a in FIG. 1. The cross-section a-a of the present example is a YZ plane that passes through the emitter region 12. The semiconductor device 100 of the present example has a semiconductor substrate 10, an interlayer dielectric film 26, the emitter electrode 52 and a collector electrode 58 in the cross-section. The interlayer dielectric film 26 is a silicate glass doped with impurities such as boron and phosphorus. The interlayer dielectric film 26 is selectively formed at the upper surface of the semiconductor substrate 10. The emitter electrode 52 is formed at the upper surface of the semiconductor substrate 10 and the interlayer dielectric film 26. The collector electrode 58 is formed at the lower surface of the semiconductor substrate 10.

The semiconductor substrate 10 may be a silicon substrate, may be a silicon carbide substrate, or may be a nitride semiconductor substrate such as garium nitride, or the like. The semiconductor substrate 10 of the present example is a silicon substrate.

The semiconductor substrate 10 has a drift region 18 of N− type. The drift region 18 of the present example is a remaining region in which the emitter region 12, the base region 14, the accumulation region 16, the buffer region 20 and the collector region 22 are not formed in the semiconductor substrate 10.

The base region 14 of P− type is formed between the upper surface of the semiconductor substrate 10 and the drift region 18. That is, the base region 14 is formed above the drift region 18 inside the semiconductor substrate 10. The base region 14 may be formed by implantation of impurities of P type such as boron from the upper surface of the semiconductor substrate 10.

The emitter region 12 of N+ type is formed at the upper surface of the base region 14. The emitter region 12 may be formed by implantation of impurities of N type such as phosphorus or arsenic from the upper surface of the semiconductor substrate 10.

The accumulation region 16 is formed between the drift region 18 and the base region 14 inside the semiconductor substrate 10. As compared to the drift region 18 and the base region 14, the accumulation region 16 is a region having a lower second-conductivity-type carrier mobility. Here, in the present example, the second conductivity type is the P type and the second-conductivity-type carriers are holes. That is, as compared to a case where the accumulation region 16 is not provided, the accumulation region 16 is a region that increases a concentration of holes accumulated below the accumulation region 16 at an on-time of the semiconductor device 100.

As one example, the accumulation region 16 is a region of N+ type having a higher doping concentration than the drift region 18. As used herein, the doping concentration refers to a concentration of impurities transformed to donors or acceptors. For example, in a region between the drift region 18 and the base region 14, the region having a doping concentration that is ten times or higher of an average value of the doping concentration of the drift region 18 may be provided as the accumulation region 16. The doping concentration of the accumulation region 16 may be fifty times or higher of the doping concentration of the drift region 18, or may be a hundred times or higher thereof. The accumulation region 16 may be formed by implantation of impurities of N type such as phosphorus or protons from the upper surface of the semiconductor substrate 10.

The accumulation region 16 of another example contains at least one type of high resistance region in an oxide region, a nitride region and a carbide region. The high resistance region is a region having a higher electric resistance than the drift region 18. For example, by implanting oxygen ions into the semiconductor substrate 10 and thermally treating the semiconductor substrate 10, the region implanted with the oxygen ions can be oxidized to have high resistance.

The gate trench portion 40 and the dummy trench portion 30 are formed from the upper surface of the semiconductor substrate 10 to the inside of the semiconductor substrate 10 to be in contact with the emitter region 12 and the base region 14 at a sidewall. The gate trench portion 40 and the dummy trench portion 30 of the present example may be formed from the upper surface of the semiconductor substrate 10 by passing through the emitter region 12 and the base region 14.

Bottom portions of the gate trench portion 40 and the dummy trench portion 30 of the present example are arranged inside the drift region 18. Note that the configuration in which the trench portion passes through doping regions is not limited to the one manufactured by a sequence of forming the trench portion after forming the doping regions. It is assumed that the configuration by forming the doping region between the trench portions after forming the trench portions is also included in the one in which the trench portion passes through the doping region.

The buffer region 20 is formed on a lower surface side of the drift region 18. The doping concentration of the buffer region 20 is higher than that of the drift region 18. The buffer region 20 may serve as a field stop layer that prevents a depletion layer that expands from the lower surface side of the base region 14, from reaching the collector region 22 of P+ type. The collector region 22 of P+ type is formed on the lower surface side of the buffer region 20.

The gate trench portion 40 includes a gate insulating film 42 and a gate conductive portion 44. The gate insulating film 42 is formed to cover an inner wall of the gate trench. The gate insulating film 42 may be formed by oxidizing or nitriding the semiconductor of the inner wall of the gate trench. The gate conductive portion 44 is covered with the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 includes, in the depth direction, at least a region facing the adjacent base region 14 across the gate insulating film 42. The gate trench portion 40 in the cross-section is covered with the interlayer dielectric film 26 at the upper surface of the semiconductor substrate 10. When a predetermined voltage is applied to the gate conductive portion 44, a channel by an inversion layer of electrons is formed in a superficial surface at an interface that is in contact with the gate trench portion 40 in the base region 14.

The dummy trench portion 30 of the present example has a dummy insulating film 32 and a dummy conductive portion 34. The dummy insulating film 32 is formed to cover an inner wall of the dummy trench. The dummy conductive portion 34 is formed inside the dummy trench portion 30, and covered with the dummy insulating film 32. The dummy insulating film 32 insulates the dummy conductive portion 34 from the semiconductor substrate 10. The dummy conductive portion 34 may be formed of the same material as that of the gate conductive portion 44. For example, the dummy conductive portion 34 is formed of the conductive material such as polysilicon. The dummy conductive portion 34 may have the same length as that of the gate conductive portion 44 in the depth direction. The dummy trench portion 30 in the cross-section is covered with the interlayer dielectric film 26 at the upper surface of the semiconductor substrate 10. Note that the bottom portions of the dummy trench portion 30 and the gate trench portion 40 may be formed in a curved surface (in a curved line in the cross-section) that is downward convex.

The existence of the dummy trench portion 30 can enhance the carrier accumulation effect and facilitate conductivity modulation so as to reduce the on-voltage. Also, when a ratio of the dummy trench portion 30 to the gate trench portion 40 is adjusted, a switching speed of the semiconductor device 100 can be adjusted.

The accumulation region 16 of the present example is formed to have a gap 60 between the accumulation region 16 and at least a partial region of the bottom portion in the gate trench portion 40. The gap 60 is a path that connects the drift region 18 to the base region 14 without going through the accumulation region 16. Due to the existence of the gap 60, at the time of turn-off of the semiconductor device 100 or the like, such a path can be provided that holes are extracted from the drift region 18 to the base region 14 without going through the accumulation region 16, so that the breakdown withstand capability of the semiconductor device 100 at turn-off (the turn-off withstand capability) can be enhanced. Also, the turn-off loss can be reduced. Note that the accumulation region 16 may be formed to have the gap 60 that connects the drift region 18 to the base region 14 even between the accumulation region 16 and at least a partial region of the bottom portion in the dummy trench portion 30.

Figure 2B:
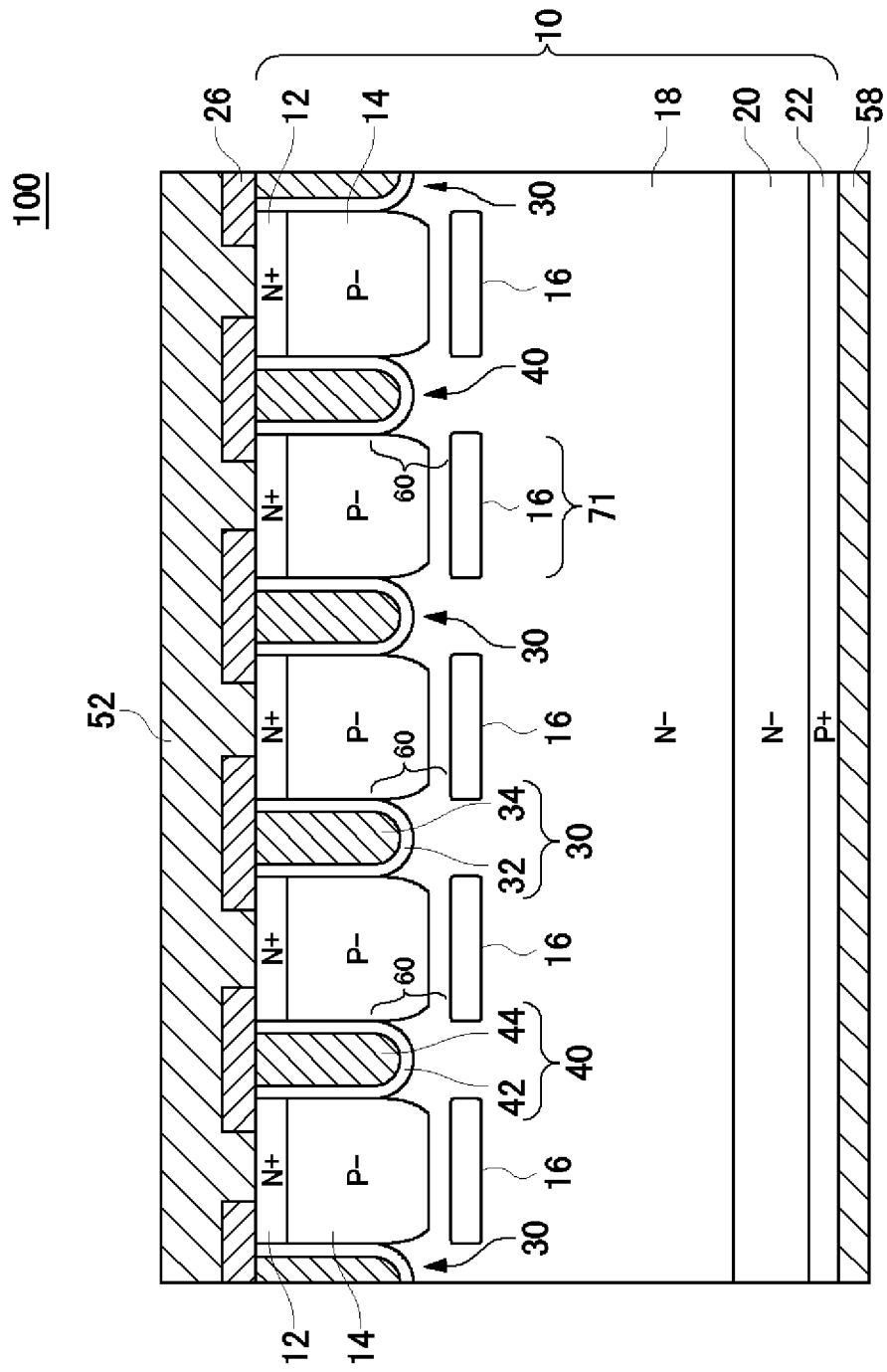
FIG. 2B shows another example in a cross-section a-a in FIG. 1.

FIG. 2B shows another example of the cross-section a-a in FIG. 1. The semiconductor device 100 of the present example is different in the position of the accumulation region 16 from the semiconductor device 100 shown in FIG. 2A. The other structures may be the same as those of the semiconductor device 100 shown in FIG. 2A.

The accumulation region 16 of the present example is arranged separated from the base region 14 in the Z-axis direction. The drift region 18 may be provided between the base region 14 and the accumulation region 16, or an N type region may be provided having a lower doping concentration than the accumulation region 16.

Also in the present example, the accumulation region 16 is formed to have the gap 60 between the accumulation region 16 and at least a partial region of the bottom portion in the trench portion. In this way, the breakdown withstand capability at turn-off (the turn-off withstand capability) of the semiconductor device 100 can be enhanced. Also, the turn-off loss can be reduced. Also, the separation between the accumulation region 16 and the base region 14 can suppress an increase in electric field strength between the accumulation region 16 and the base region 14 to suppress decrease in breakdown voltage.

Figure 3A:
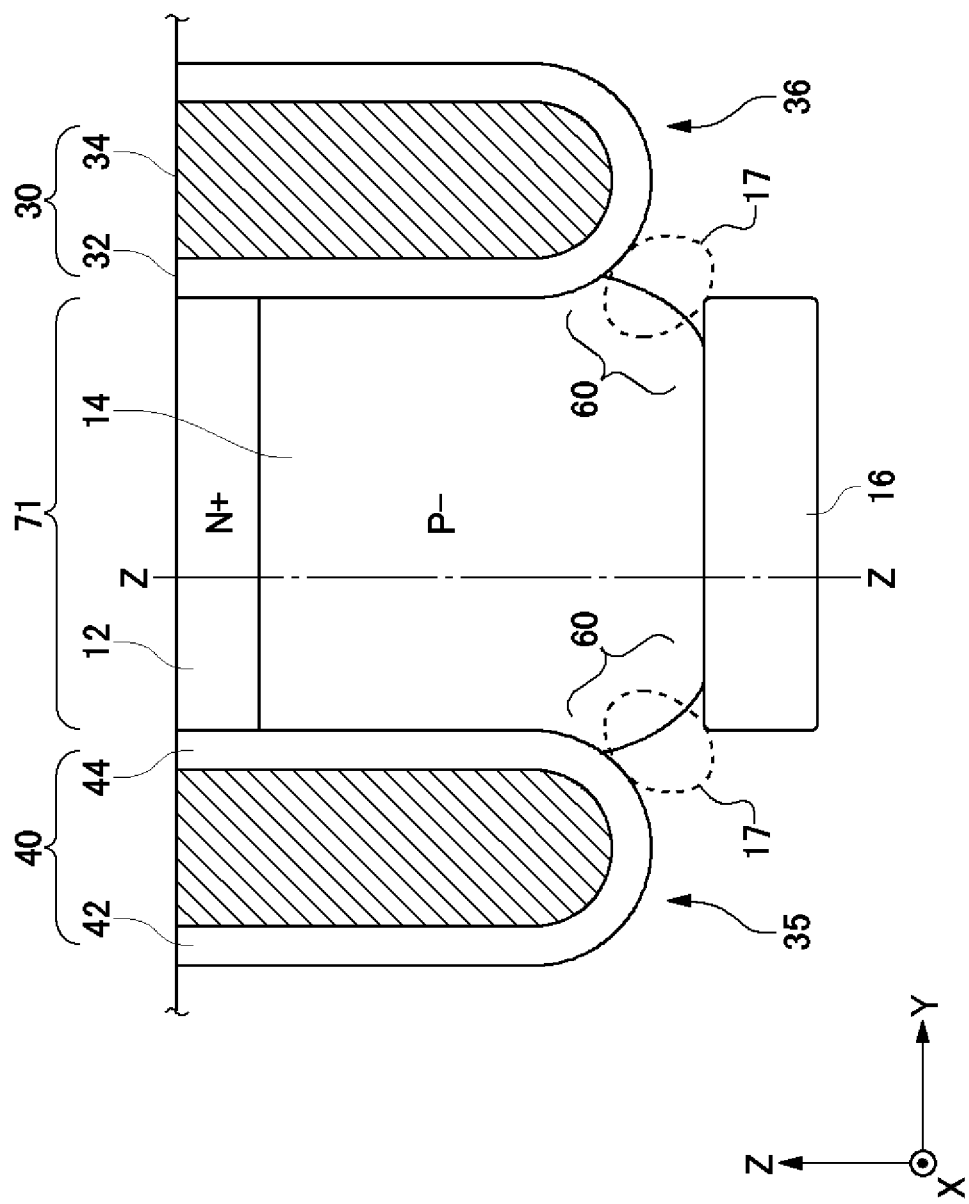
FIG. 3A shows an enlarged cross-sectional view in the vicinity of one mesa portion 71 sandwiched by a gate trench portion 40 and a dummy trench portion 30.

FIG. 3A shows an enlarged cross-sectional view in the vicinity of one mesa portion 71 sandwiched by the gate trench portion 40 and the dummy trench portion 30 in the example shown in FIG. 2A. As mentioned above, a region that is not provided with the accumulation region 16 (gap 60) exists in at least a partial region between the accumulation region 16 and the gate trench portion 40. That region has a higher second-conductivity-type carrier mobility than the accumulation region 16. As used herein, a region through which carriers pass via that region (gap 60) is referred to as a carrier passage region 17. That is, the carrier passage region 17 substantially centers around the gap 60 and extends beyond the gap 60.

The carrier passage region 17 of the present example includes a part of the drift region 18. That is, the carrier passage region 17 of the present example includes a remaining portion in which the accumulation region 16 is not formed, in the drift region 18 in direct contact with the base region 14.

The accumulation region 16 of the present example is provided lower than a lower end of the gate trench portion 40. The accumulation region 16 is provided to overlap the entire lower surface of the base region 14 in the cross-section. The lower surface of the base region 14 refers to the entire surface of the base region 14 as seen from a negative side along the Z-axis (that is, the collector region 22 side). A configuration in which the accumulation region 16 overlaps the entire lower surface of the base region 14 refers to a state in which the entire lower surface of the base region 14 is covered with the accumulation region 16 when viewed from the collector region 22 side. As one example, a width of the accumulation region 16 in the Y-axis direction is the same as or larger than a width of the mesa portion 71 sandwiched by two trench portions.

If the base region 14 is even partially not covered with the accumulation region 16 when viewed from the collector side, the carrier accumulation effect may drop sharply to increase the on-voltage. When the accumulation region 16 is provided to cover at least the entire lower surface of the base region 14 in the Y-axis direction, the carrier accumulation effect can be enhanced to decrease the on-voltage.

Also, since the carrier passage region 17 is provided, the carriers can be appropriately extracted at turn-off or the like. At turn-off, a bias that moves the holes to the emitter side is applied. Thus, even if the entire base region 14 is covered with the accumulation region 16, the presence of the carrier passage region 17 allows the holes to be extracted to the emitter side. Accordingly, the withstand cability of the semiconductor device 100 can be enhanced and, at the same time, the turn-off loss can be reduced.

In particular, since a channel in which an electron current flows is formed in the vicinity of the gate trench portion 40, holes also are easy to pass through the vicinity of the gate trench portion 40. Since the carrier passage region 17 is in contact with the bottom portion of the gate trench portion 40, the holes can be extracted efficiently at turn-off or the like. The carrier passage regions 17 may be continuously formed or discretely arranged in the X-axis direction. For example, in the vicinity of the bottom portion of the gate trench portion 40, the carrier passage region 17 may occupy a partial area in the X-axis direction and the carrier passage region 17 and may not occupy a different partial area in the X-axis direction. Also, the carrier passage region 17 may be provided also in a region in contact with the bottom portion of the dummy trench portion 30.

Also, the accumulation region 16 may cover a range wider than the base region 14. For example, in the cross-section of FIG. 3A, the accumulation region 16 may be provided to overlap a part of the lower surface 35 of the gate trench portion 40. Similarly, the accumulation region 16 may be provided to overlap a part of the lower surface 36 of the dummy trench portion 30. Also, the accumulation region 16 may be connected to the lower surface 36 of the dummy trench portion 30. That is, the carrier passage region 17 does not need to be provided in the vicinity of the lower surface of the dummy trench portion 30.

Figure 3B:
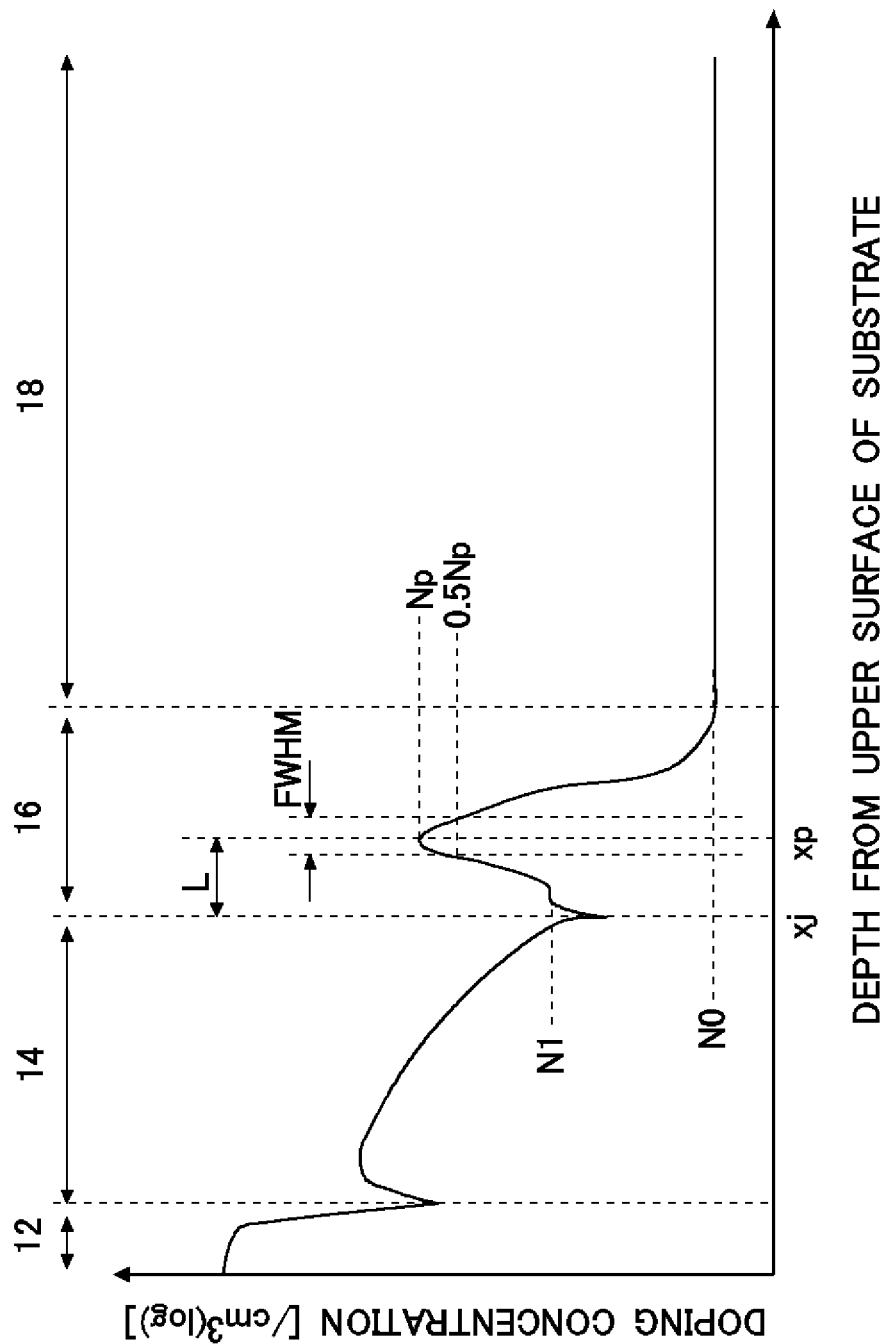
FIG. 3B shows one example of a doping concentration distribution in a position Z-Z of FIG. 3A.

FIG. 3B shows one example of a doping concentration distribution in a position Z-Z of FIG. 3A. In the present example, a peak value of the doping concentration in the accumulation region 16 is denoted by Np, a peak position is denoted by xp, and the doping concentration of the drift region 18 is denoted by N0. Also, a depth position at which the acceptor concentration of the base region 14 becomes equal the donor concentration of the N type region arranged under the base region 14 donor (that is, the position of the pn junction) is denoted by xj, and the acceptor and donor concentrations at the depth position xj are denoted by N1.

As used herein, a state in which the concentration N1 is more than ten times of the concentration N0 is defined as a state in which the accumulation region 16 is in contact with the base region 14. As the peak position xp of the accumulation region 16 is provided at a deeper position with respect to the upper surface of the substrate, the concentration N1 is lowered.

Figure 3C:
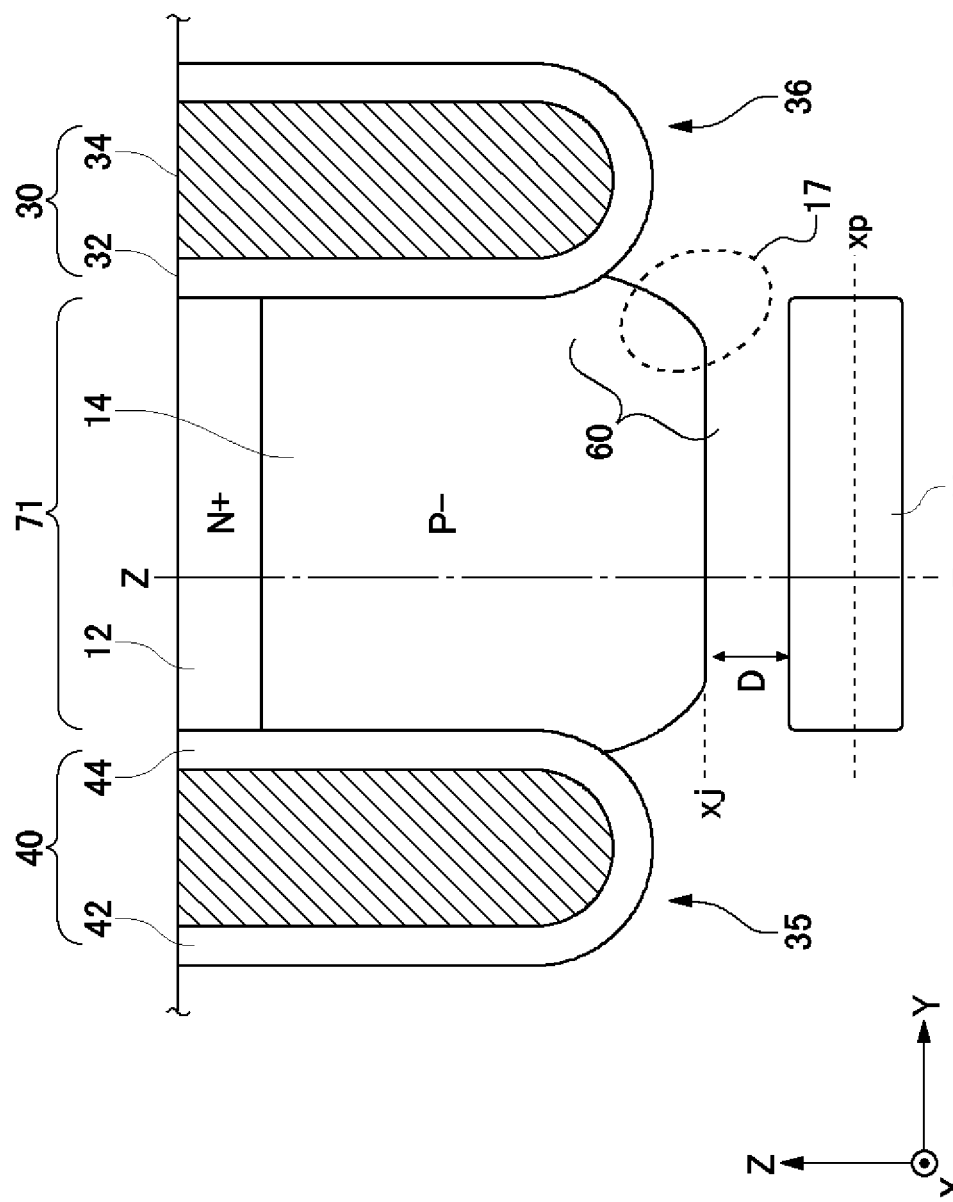
FIG. 3C shows an enlarged cross-sectional view in the vicinity of the one mesa portion 71 sandwiched by the gate trench portion 40 and the dummy trench portion 30 in the example shown in FIG. 2B.

FIG. 3C shows an enlarged cross-sectional view in the vicinity of the one mesa portion 71 sandwiched by the gate trench portion 40 and the dummy trench portion 30 in the example shown in FIG. 2B. As used herein, a distance between a lower end of the base region 14 (that is, position xj) and an upper end of the accumulation region 16 is denoted by D.

Figure 3D:
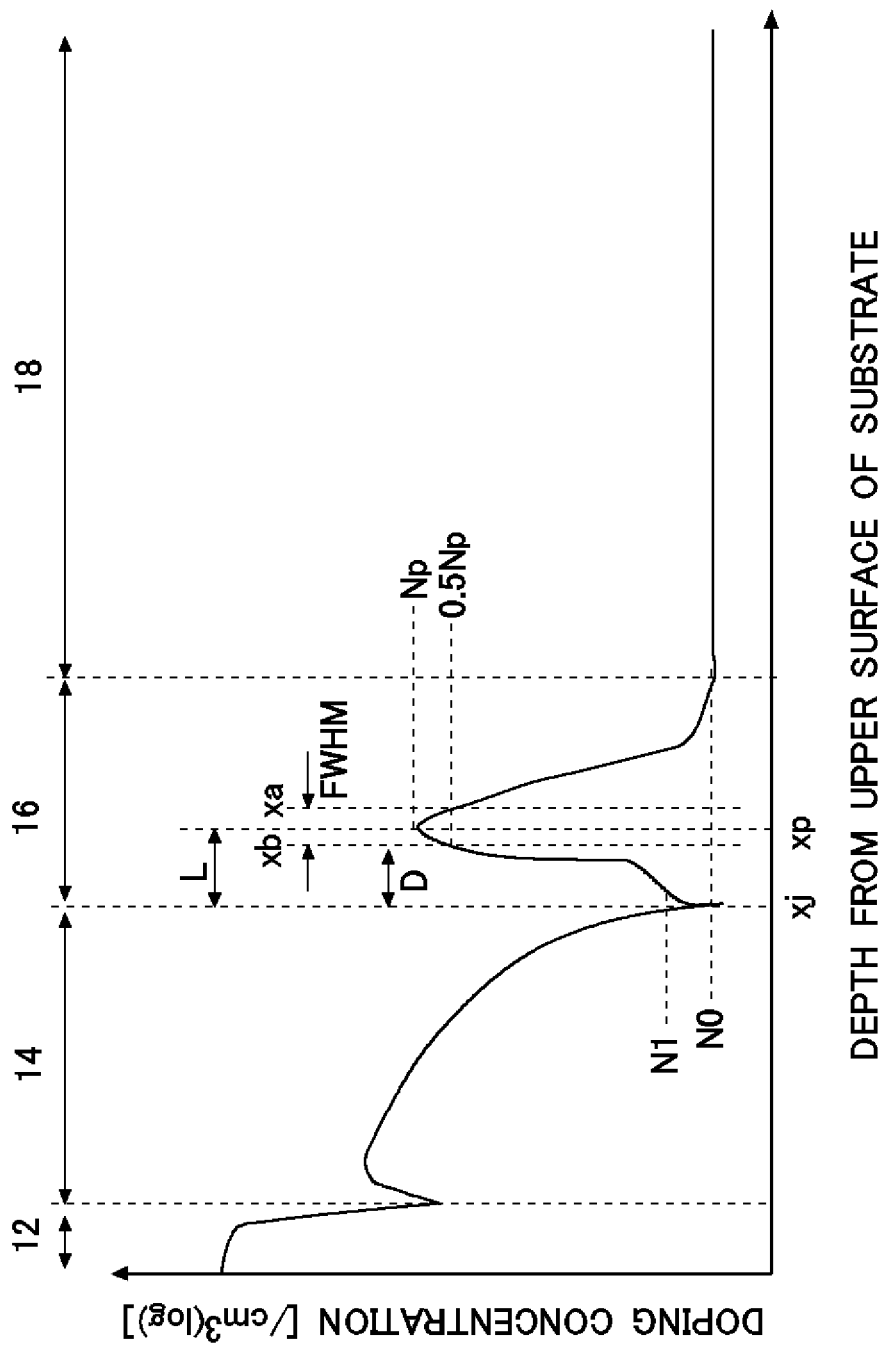
FIG. 3D shows one example of a doping concentration distribution in a position Z-Z of FIG. 3C.

FIG. 3D shows one example of a doping concentration distribution in a position Z-Z of FIG. 3C. In the present example, the concentration N1 is ten times or less of the concentration N0. As used herein, a state in which the concentration N1 is ten times or less of the concentration N0 is defined as a state in which the accumulation region 16 is separated from with the base region 14.

Note that a depth position in which the doping concentration of the accumulation region 16 exhibits 0.5 Np that is a half value of the peak concentration Np is denoted by xb, xa. The position Xb is a position on a base region 14 side, and the position Xa is a position on a drift region 18 side. A distance D between the accumulation region 16 and the base region 14 is defined as a distance from a depth position xj to a depth position xb in the Z-axis direction.

The distance D may be equal to or less than a distance from the upper surface of the substrate to the depth position xj, or may also be half or less of the distance. Also, the distance D may be equal to or less than a distance between two positions each of which the concentration exhibits 0.01 Np (referred to as FW1% M) in a doping concentration distribution of the accumulation region 16, or may be a full width at half maximum FWHM or less in the doping concentration distribution of the accumulation region 16. The distance D may be zero or more, may be the FWHM or more, or may be FW1% M or more.

Figure 4A:
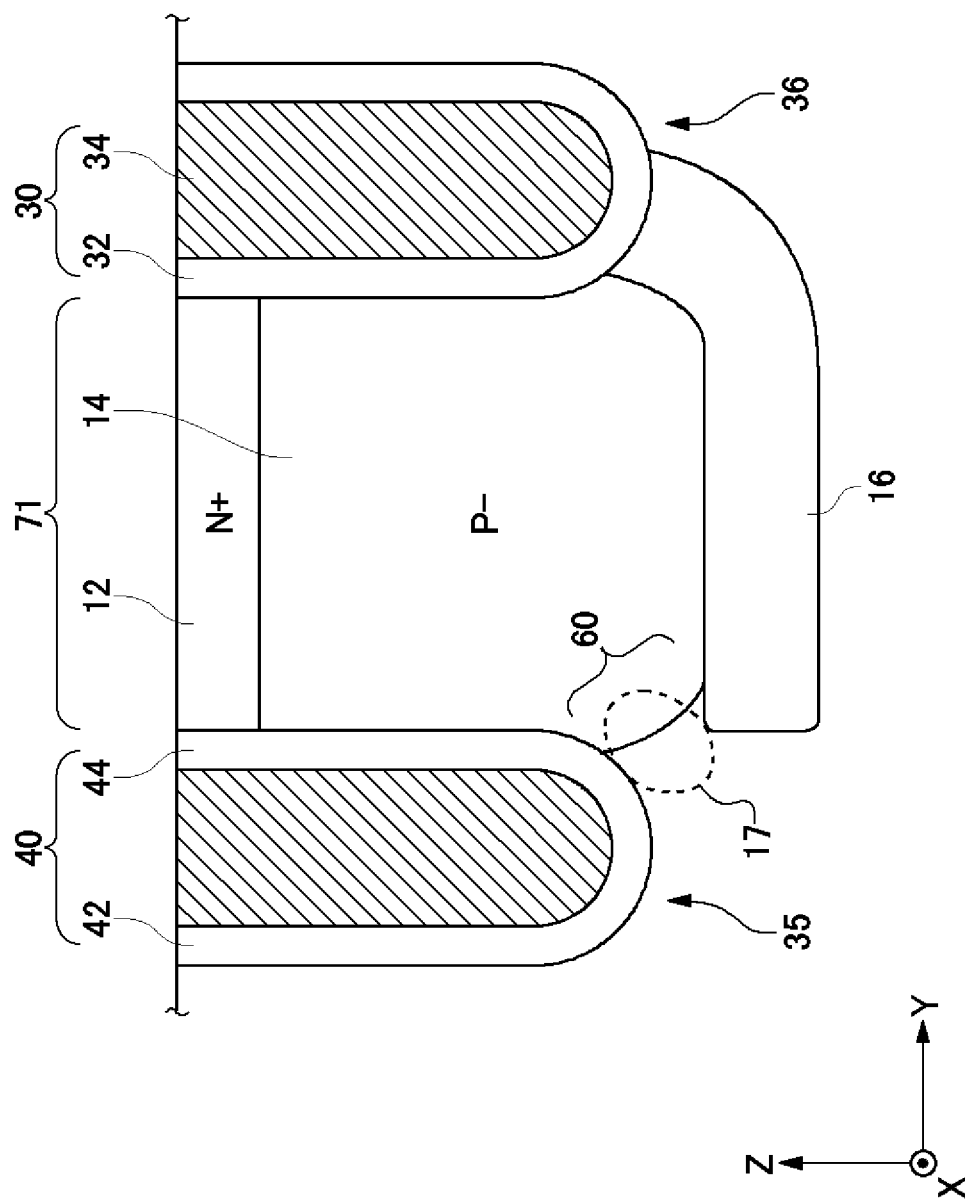
FIG. 4A is another example of an enlarged cross-sectional view in the vicinity of the mesa portion 71.

FIG. 4A is another example of an enlarged cross-sectional view in the vicinity of the mesa portion 71. The accumulation region 16 in the present example is connected to the lower surface 36 of the dummy trench portion 30. That is, the carrier passage region 17 is not provided between the accumulation region 16 and the dummy trench portion 30. However, the carrier passage region 17 is provided between the lower surface 35 of the gate trench portion 40 and the accumulation region 16. Also with such a configuration, the carrier passage region 17, which is provided in the vicinity of the lower surface 35 of the gate trench portion 40, makes it easy to extract the holes to the emitter side at turn-off or the like.

Figure 4B:
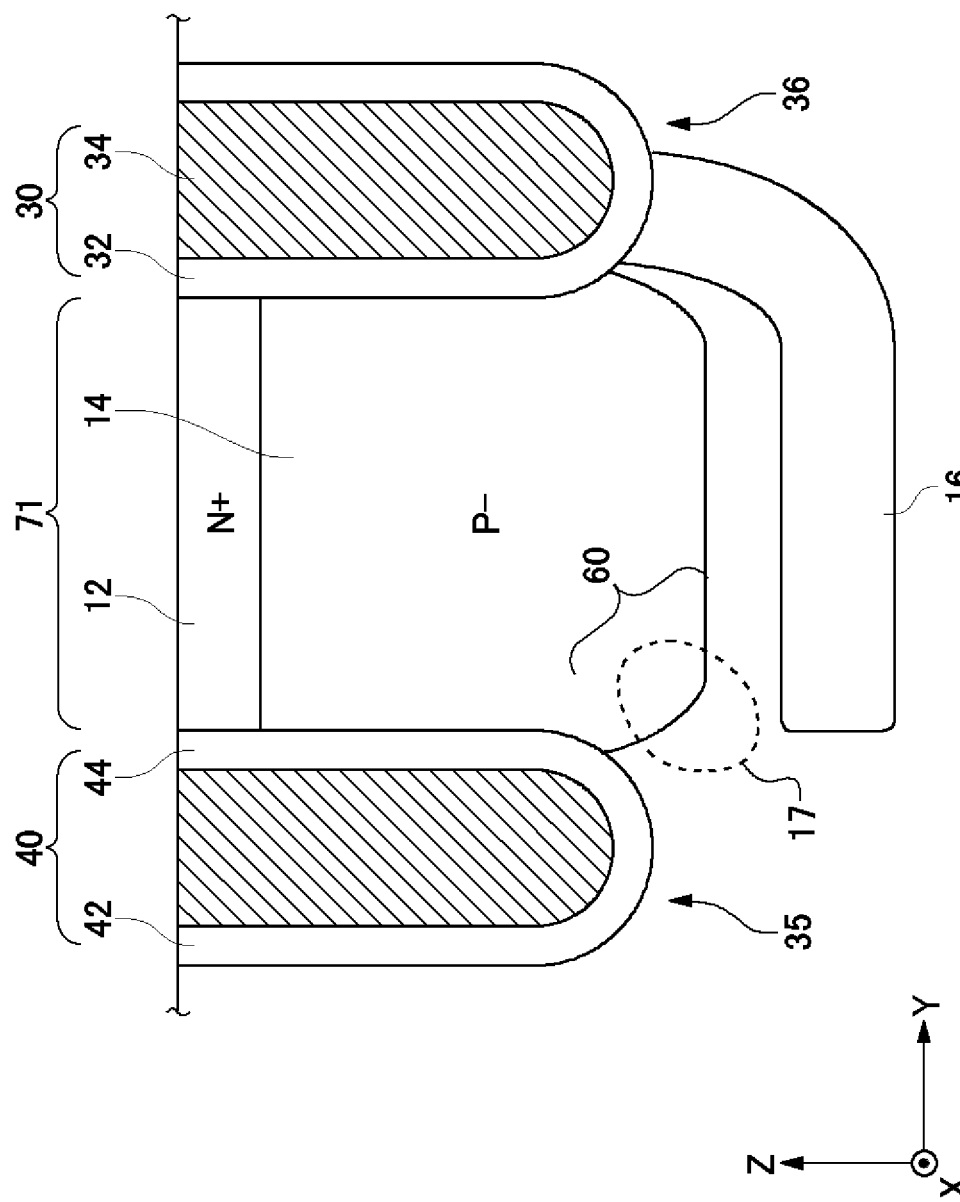
FIG. 4B is another example of an enlarged cross-sectional view in the vicinity of the mesa portion 71.

FIG. 4B is another example of an enlarged cross-sectional view in the vicinity of the mesa portion 71. The present example is similar to the example of FIG. 4A except that the accumulation region 16 is separated from the base region 14. A distance between the accumulation region 16 and the base region 14 is similar to that in the example illustrated in FIG. 3C and FIG. 3D.

Figure 5A:
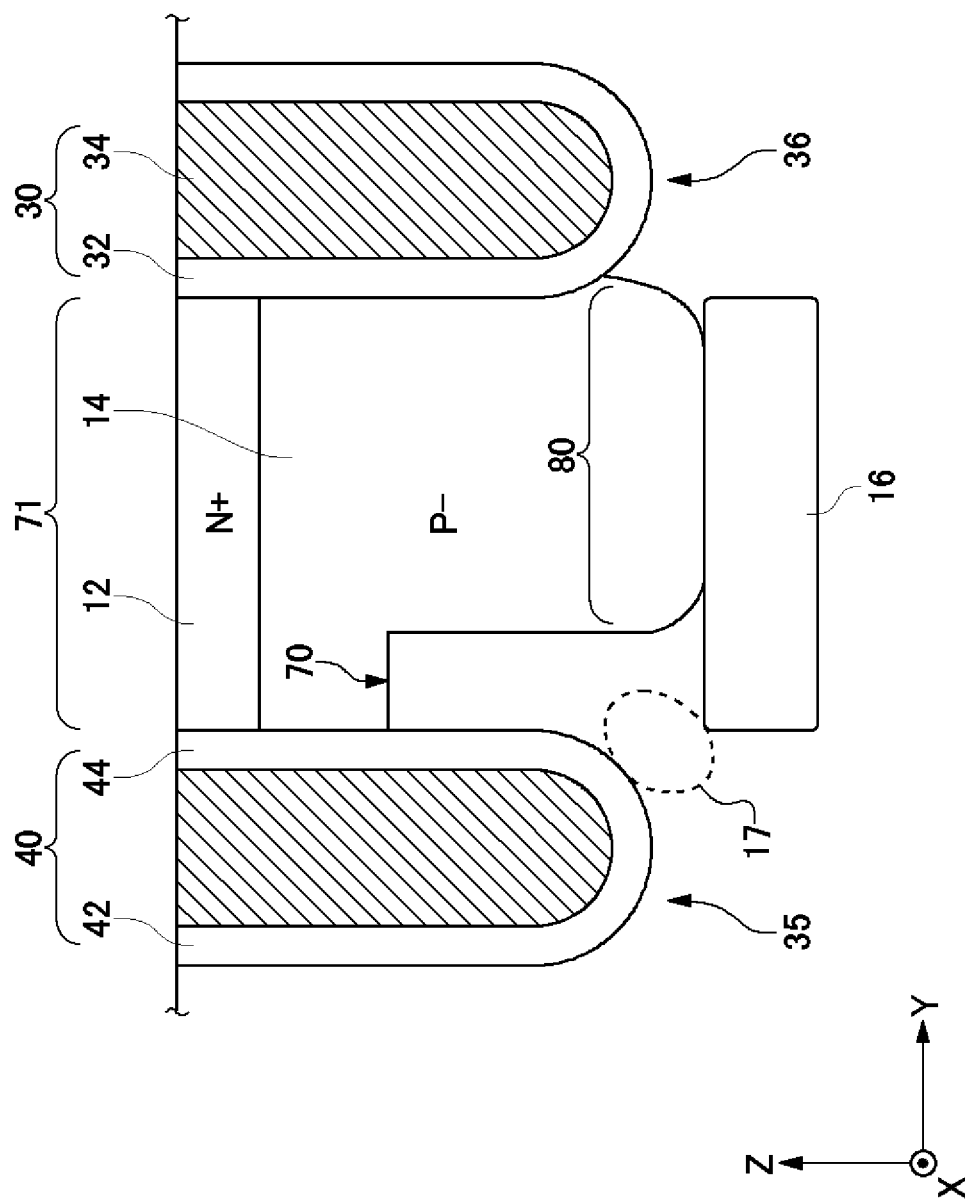
FIG. 5A is another example of an enlarged cross-sectional view in the vicinity of the mesa portion 71.

FIG. 5A is another example of an enlarged cross-sectional view in the vicinity of the mesa portion 71. The base region 14 of the present example has a gate adjacent region 70 in direct contact with the gate trench portion 40, and a dummy adjacent region 80 in direct contact with the dummy trench portion 30.

The dummy adjacent region 80 is formed to a deeper position than the gate adjacent region 70 when viewed from the upper surface of the semiconductor substrate 10. For depths of the dummy adjacent region 80 and the gate adjacent region 70, depths of portions in contact with the respective trench portions may be used.

In this case, the drift region 18 is also formed between the accumulation region 16 and the gate adjacent region 70. With such a structure, a distance between the carrier passage region 17 and the base region 14 can be made larger. Accordingly, carrier accumulation effect in a case where the semiconductor device 100 is in an on-state can be increased.

Note that a lower end of the gate adjacent region 70 may be arranged higher than the center of the gate trench portion 40 in the Z-axis direction. The lower end of the dummy adjacent region 80 may be arranged lower than the center of the dummy trench portion 30 in the Z-axis direction. A lower end of the dummy adjacent region 80 may be arranged lower than the lower surface 36 of the dummy trench portion 30. The dummy adjacent region 80 may be connected to the accumulation region 16. A depth of a connection portion between the gate adjacent region 70 and the dummy adjacent region 80 may be sharply changed stepwise as shown in FIG. 5A, or may be gradually changed with a slope.

Note that in another example, a central part of the base region 14 in the Y-axis direction may have a shape that is downward convex. In this case, the drift region 18 is also formed between the dummy adjacent region 80 and the accumulation region 16.

Figure 5B:
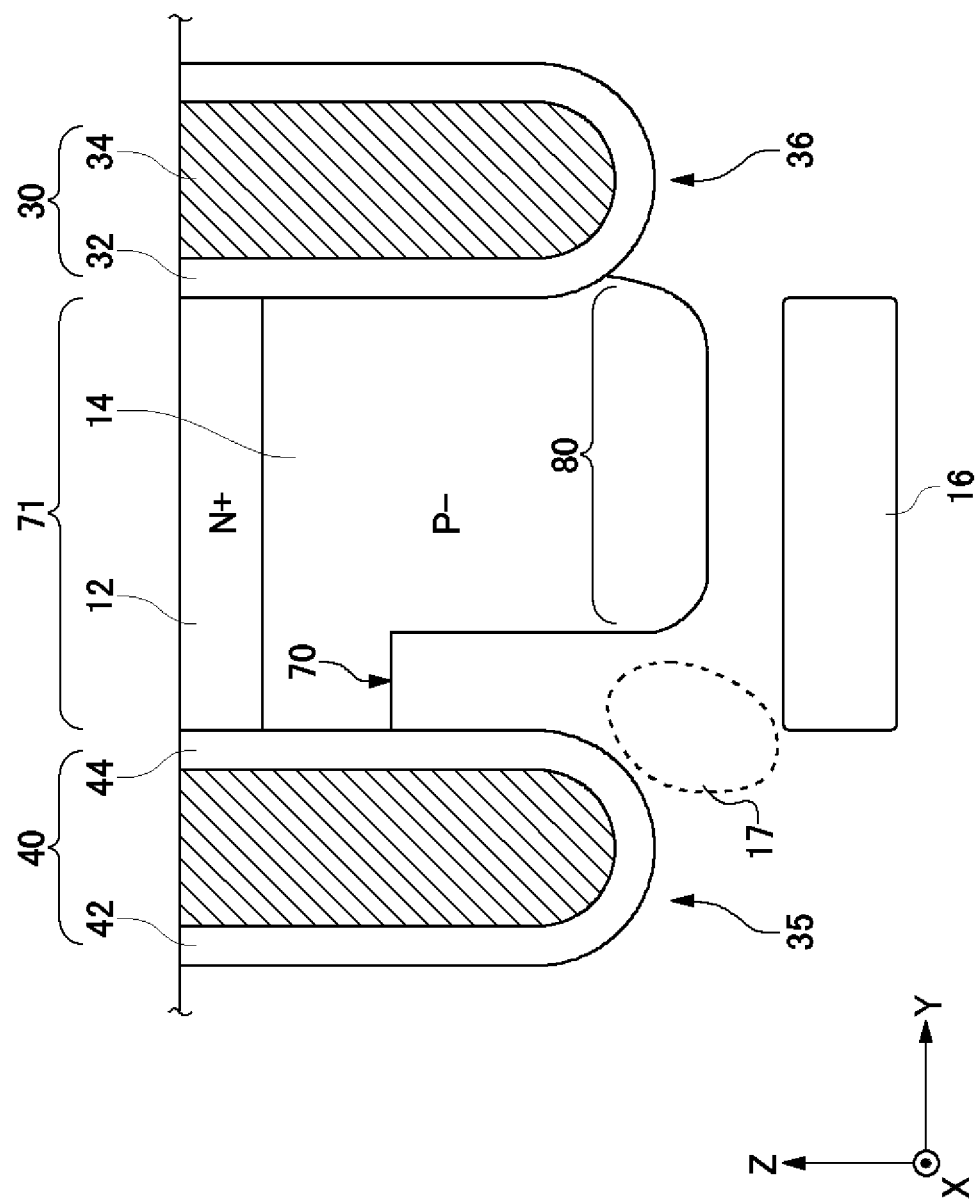
FIG. 5B is another example of an enlarged cross-sectional view in the vicinity of the mesa portion 71.

FIG. 5B is another example of an enlarged cross-sectional view in the vicinity of the mesa portion 71. The present example is similar to the example of FIG. 5A except that the accumulation region 16 is separated from the base region 14. A distance between the accumulation region 16 and the base region 14 is similar to that in the example illustrated in FIG. 3C and FIG. 3D.

Figure 6:
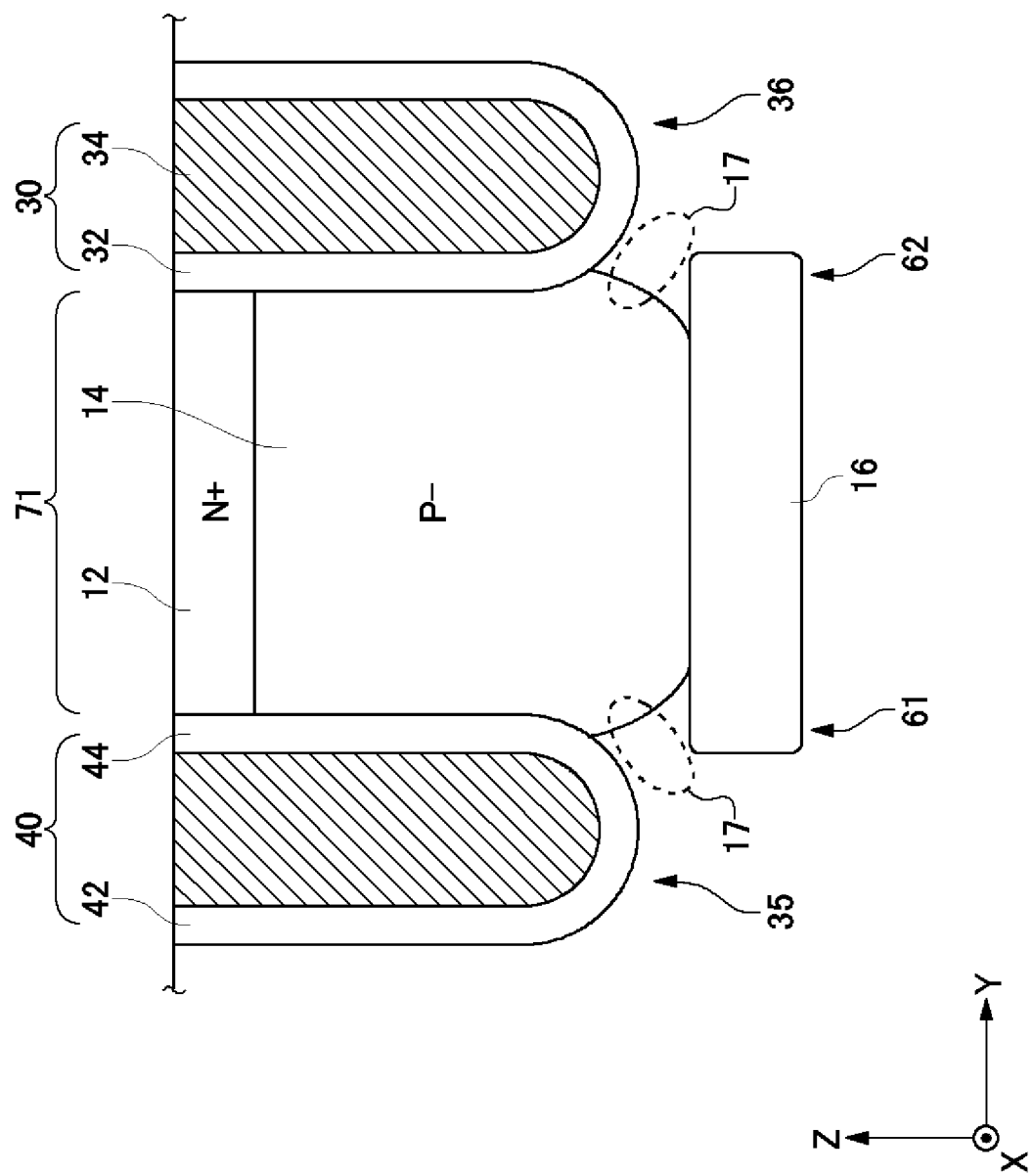
FIG. 6 is another example of an enlarged cross-sectional view in the vicinity of the mesa portion 71.

FIG. 6 is another example of an enlarged cross-sectional view in the vicinity of the mesa portion 71. The accumulation region 16 of the present example has an end portion 61 that overlaps a part of the lower surface 35 of the gate trench portion 40. The accumulation region 16 may further have an end portion 62 that overlaps a part of the lower surface 36 of the dummy trench portion 30. With such a structure, the carrier accumulation effect can be enhanced.

The Y-axis width of the end portion 61 that overlaps the gate trench portion 40 may be smaller or larger than the width of the gate insulating film 42. Also, in order to form the carrier passage region 17 with a sufficient dimension, the Y-axis width of the end portion 61 that overlaps the gate trench portion 40 is smaller than half the width of the gate trench portion 40, for example, equal to or smaller than one fourth.

Figure 7:
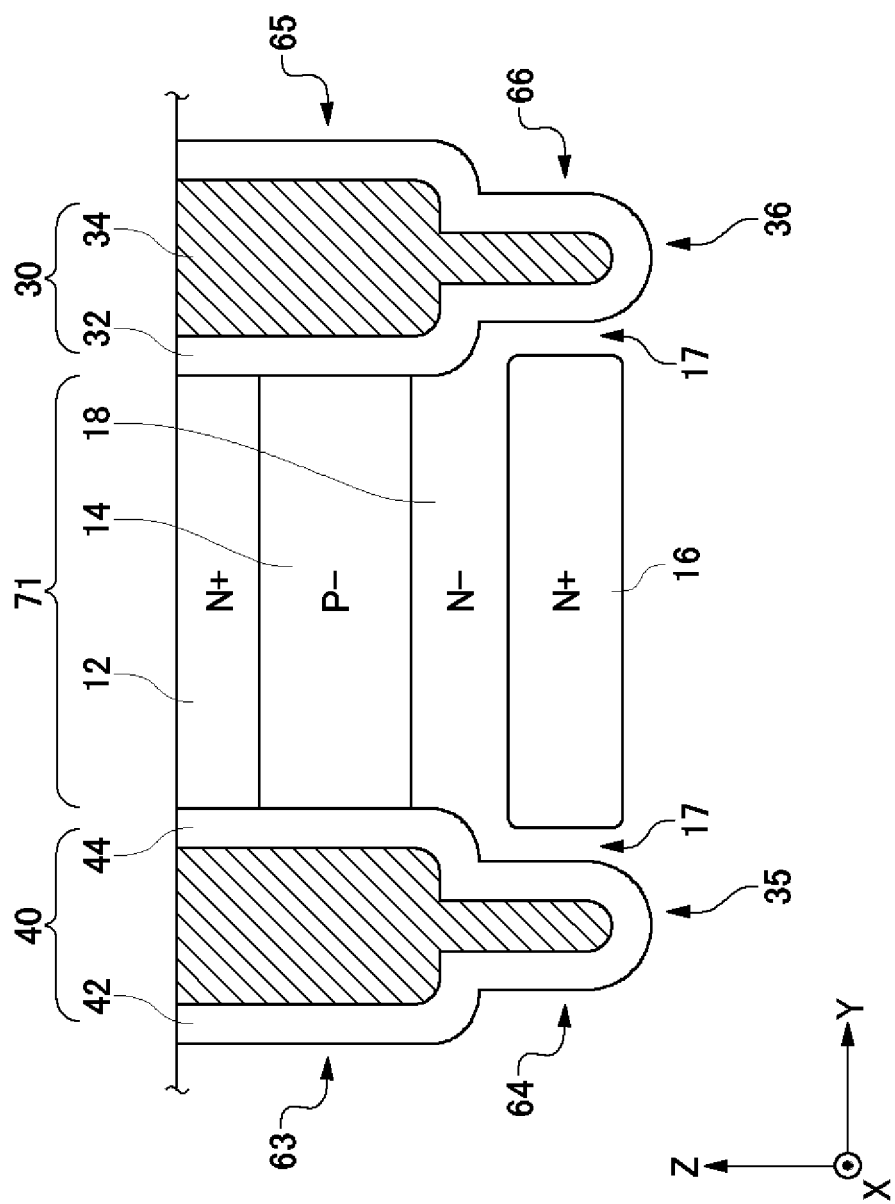
FIG. 7 is another example of an enlarged cross-sectional view in the vicinity of the mesa portion 71.

FIG. 7 is another example of an enlarged cross-sectional view in the vicinity of the mesa portion 71. The gate trench portion 40 of the present example has an upper portion 63 and a lower portion 64. The upper portion 63 is in direct contact with the upper surface of the semiconductor substrate 10. The lower portion 64 is provided under the upper portion 63, and a width of the lower portion 64 in the Y-axis direction is narrower than that of the upper portion 63. The upper portion 63 includes a region facing the base region 14, and the lower portion 64 includes a region facing the accumulation region 16. A width of a region facing the base region 14 may be used for a width of the upper portion 63 in the Y-axis direction, and a width of a region facing the accumulation region 16 may be used for a width of the lower portion 64 in the Y-axis direction. A width of a connection portion between the upper portion 63 and the lower portion 64 may be sharply changed stepwise as shown in FIG. 7, or may be gradually changed with a slope.

Also in the case of the present example, the accumulation region 16 is formed to cover the entire base region 14. However, since the gate trench portion 40 has the lower portion 64 with a smaller width, the accumulation region 16 can be formed at a higher position than the lower surface 35 of the gate trench portion 40. The drift region 18 may be formed between the accumulation region 16 and the base region 14, or the upper surface of the accumulation region 16 may be connected to the lower surface of the base region 14. In the latter case, the accumulation region 16 may have a top portion facing the upper portion 63 of the gate trench portion 40, and a bottom portion facing the lower portion 64. A width at the top portion of the accumulation region 16 in the Y-axis direction may be smaller than that of the bottom portion.

In the present example, the carrier passage region 17 is provided between the accumulation region 16 and a sidewall of the lower portion 64 of the gate trench portion 40. The carrier passage region 17 is provided to the base region 14 along the sidewall of the gate trench portion 40.

According to the present example, the accumulation region 16 can be provided inside the mesa portion 71. For this reason, the thickness of the drift region 18 of N-type can be ensured.

Note that similarly to the gate trench portion 40, the dummy trench portion 30 may have an upper portion 65 and a lower portion 66. The upper portion 65 and the lower portion 66 of the dummy trench portion 30 may be provided at the same depth positions as those of the upper portion 63 and the lower portion 64 of the gate trench portion 40, respectively. In this case, the carrier passage region 17 may be provided between the accumulation region 16 and a sidewall of the dummy trench portion 30.

In another example, the accumulation region 16 may be connected to the sidewall of the dummy trench portion 30. In this case, the dummy trench portion 30 may have a substantially uniform width, or may have the upper portion 65 and the lower portion 66.

Figure 8:
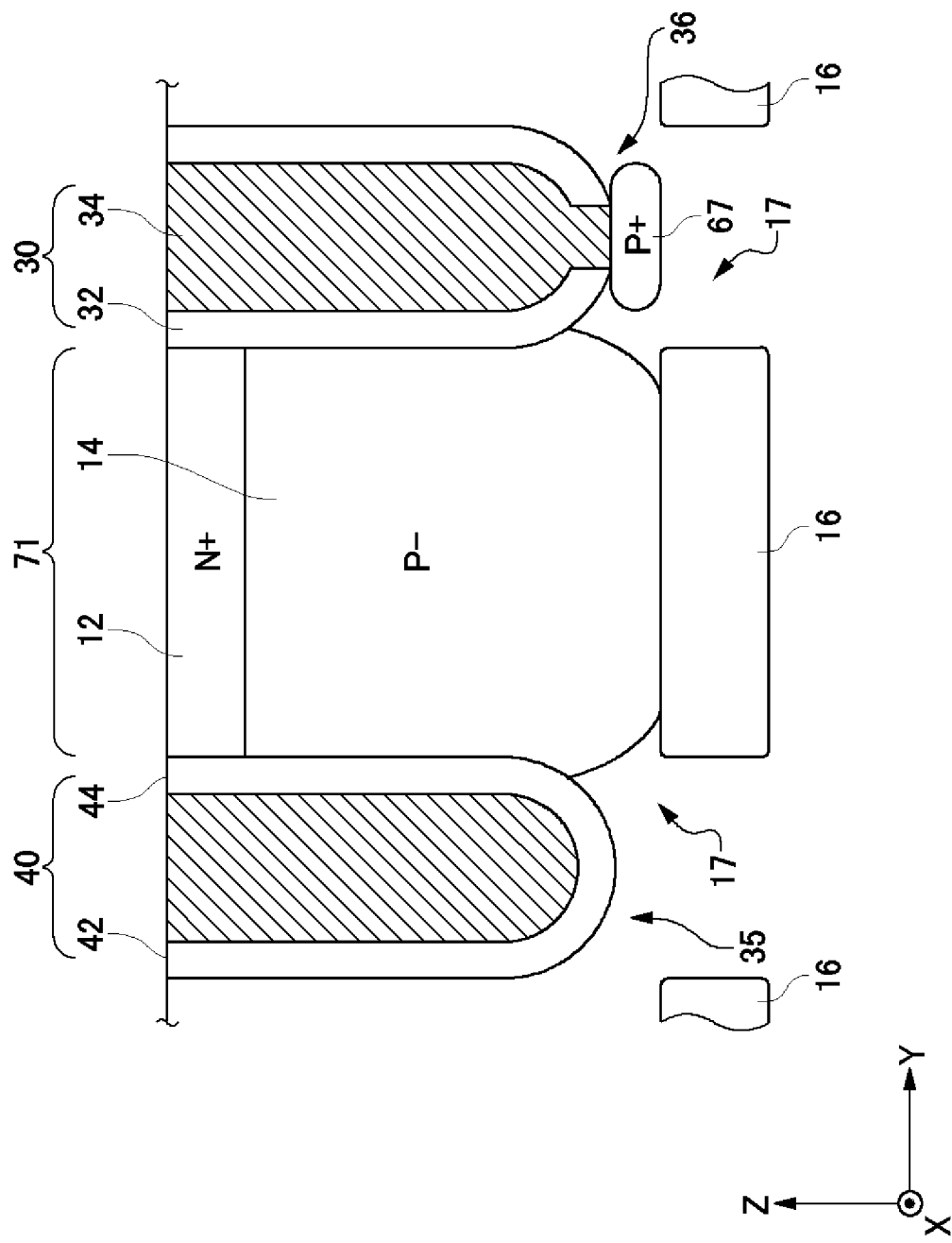
FIG. 8 is another example of an enlarged cross-sectional view in the vicinity of the mesa portion 71.

FIG. 8 is another example of an enlarged cross-sectional view in the vicinity of the mesa portion 71. In the dummy trench portion 30 of the present example, the dummy insulating film 32 is formed in at least a part of the bottom portion. That is, in the bottom portion of the dummy trench portion 30, a through hole is formed in the dummy insulating film 32. The dummy conductive portion 34 is filled in the through hole. In this way, the dummy conductive portion 34 is in contact with the semiconductor substrate 10 at the bottom portion of the dummy trench portion 30. Note that the carrier passage region 17 is formed in the vicinity of the bottom portion of the bottom portion of the dummy trench portion 30.

With such a structure, the holes accumulated below the accumulation region 16 can be extracted through the dummy conductive portion 34 at turn-off or the like. For this reason, the withstand capability of the semiconductor device 100 can be further improved, and the turn-off loss can be further reduced.

In the semiconductor substrate 10, a P type region 67 may be provided in a region in contact with the dummy conductive portion 34. A doping concentration of the region 67 may be higher than that of the base region 14. Such a structure can facilitate the extraction of the holes by the dummy conductive portion 34. It is preferable that the region 67 is in no contact with the accumulation region 16. A lower surface of the region 67 may be provided higher than the upper surface of the accumulation region 16.

Figure 9:
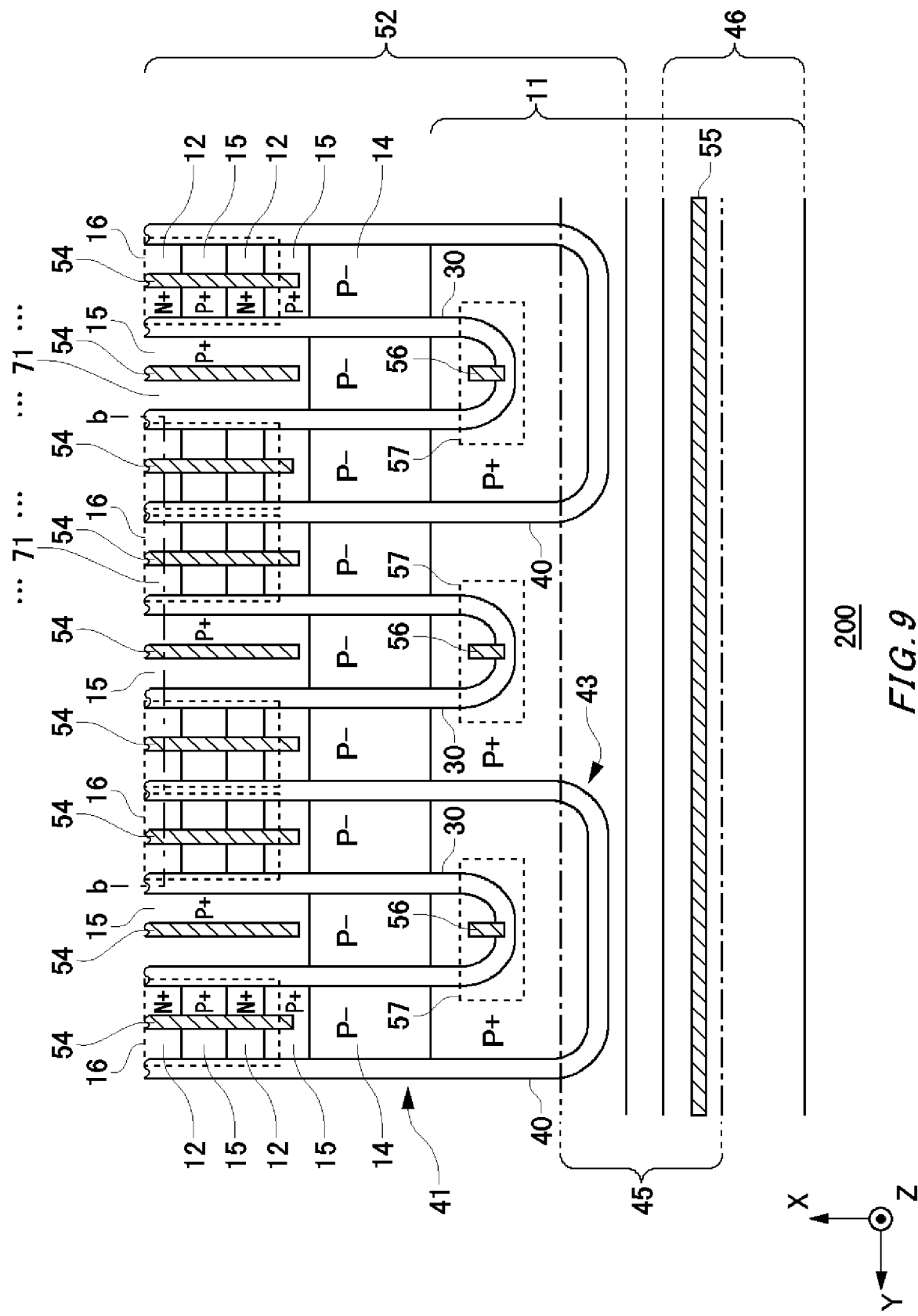
FIG. 9 shows a part of an upper surface of a semiconductor device 200 according to an embodiment in the present invention.

FIG. 9 shows a part of an upper surface of a semiconductor device 200 according to an embodiment in the present invention. In the semiconductor device 200, positions in which the accumulation region 16 and the carrier passage region 17 are formed are different from those of the semiconductor devices 100 shown in FIG. 1 to FIG. 8.

In the semiconductor device 100 shown in FIG. 1, the accumulation region 16 is provided even in the region sandwiched by the dummy trench portions 30, while in the semiconductor device 200, the accumulation region 16 is not provided in the region sandwiched by the dummy trench portions 30. Note that the emitter region 12 is not provided in the region sandwiched by the dummy trench portions 30, and the contact region 15 may be provided therein. The other structures may be the same as those of any of the semiconductor devices 100 shown in FIG. 1 to FIG. 8.

Figure 10:
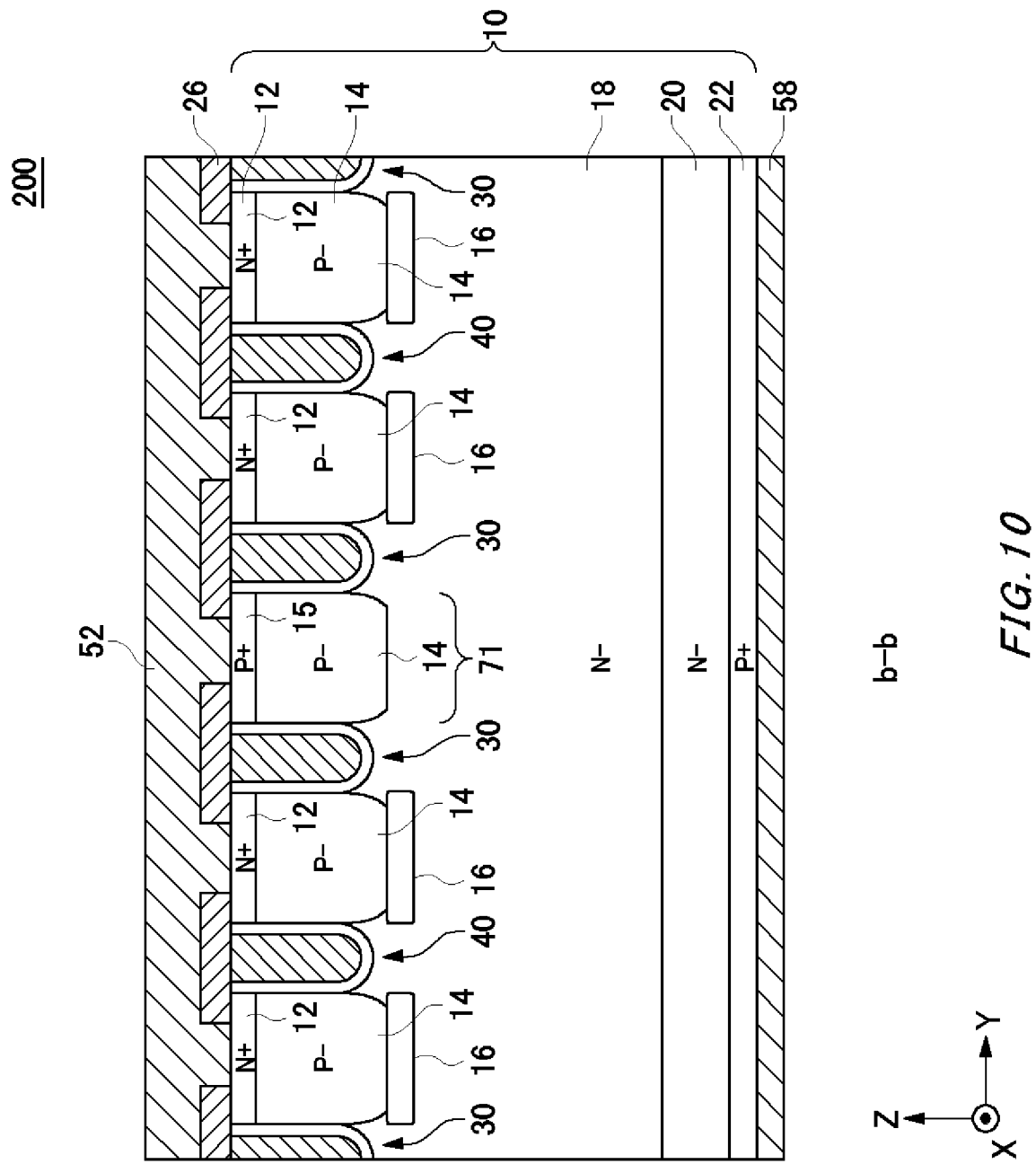
FIG. 10 shows one example in a cross-section b-b in FIG. 1.

FIG. 10 shows one example in a cross-section b-b in FIG. 9. The cross-section b-b of the present example is the YZ plane that passes through the emitter region 12. As mentioned above, the accumulation region 16 is not provided below the mesa portion 71 sandwiched by the dummy trench portions 30. The drift region 18 that serves as the carrier passage region 17 is provided below the mesa portion 71 sandwiched by the dummy trench portions 30. Such a structure can further facilitate the extraction of the holes at turn-off or the like.

FIG. 11, FIG. 12, FIG. 13 and FIG. 14 each are a top view showing an arrangement example of the accumulation region 16 and the carrier passage region 17. Each arrangement example shown in FIG. 11 to FIG. 14 may be applied to any of the semiconductor devices 100 illustrated in FIG. 1 to FIG. 8. In FIG. 11 to FIG. 14, there is shown a portion in which the gate trench portion 40 is provided along a predetermined linear direction (X-axis direction in the present example) at the upper surface of the semiconductor substrate 10. Also, the emitter region 12 and the contact region 15 may be exposed alternately in the X-axis direction to the upper surface of the mesa portion 71 in direct contact with the gate trench portion 40.

Figure 11:
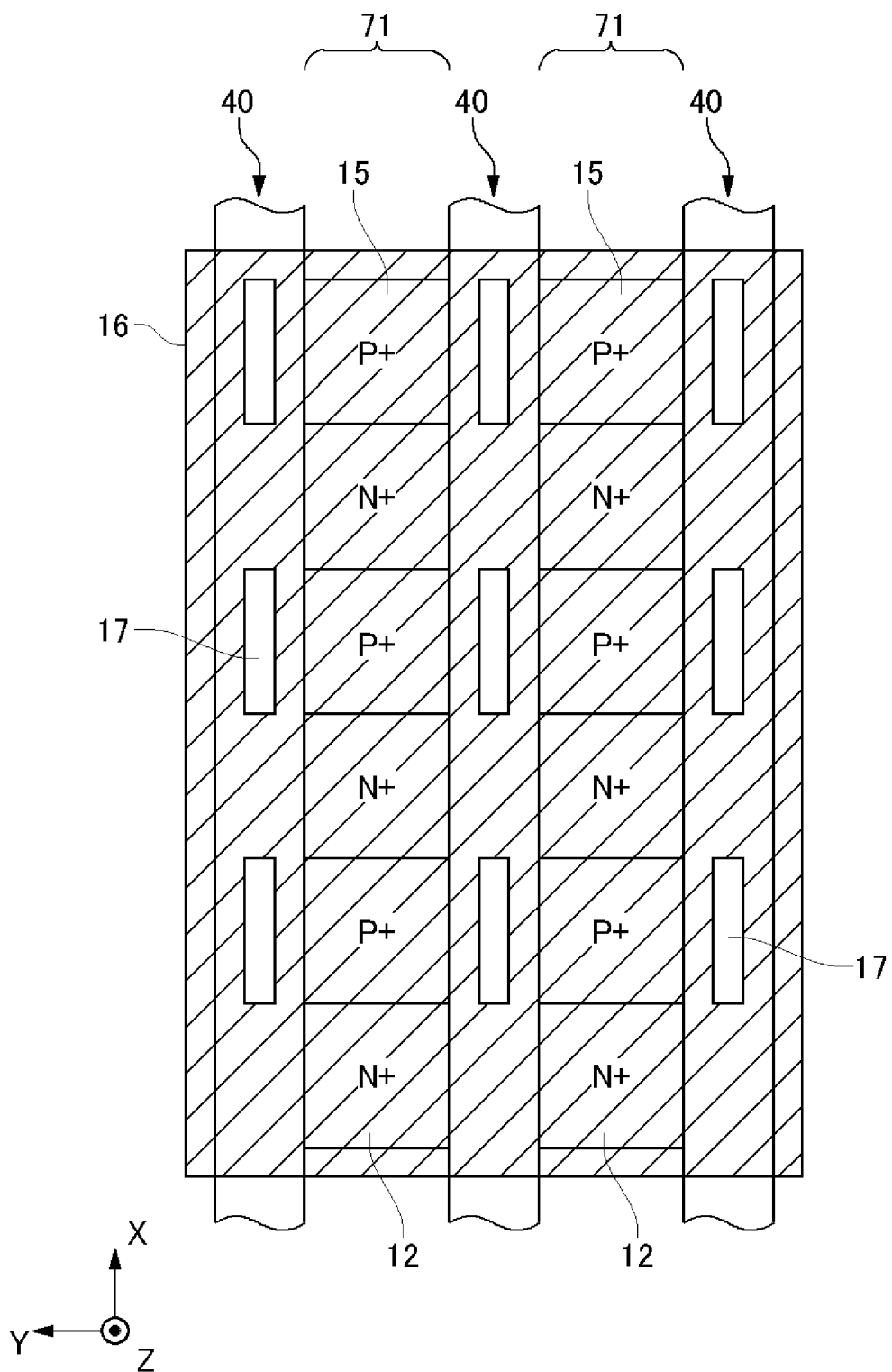
FIG. 11 is a top view showing an arrangement example of an accumulation region 16 and a carrier passage region 17.

In the example of FIG. 11, the carrier passage region 17 is arranged at a position overlapping the gate trench portion 40. Also, the carrier passage region 17 of the present example is arranged discretely in the X-axis direction. As shown in FIG. 11, the carrier passage region 17 may be positioned to overlap the gate trench portion 40 and, at the same time, to face the contact region 15. In this way, the distance between the carrier passage region 17 and the contact region 15 can be reduced, which can facilitate the extraction of the carriers.

In another example, the carrier passage region 17 may be positioned to overlap the gate trench portion 40 and, at the same time, to face the emitter region 12. In this case, the distance between the carrier passage region 17 and the contact region 15 can be increased, so that the carrier accumulation effect can be enhanced.

In the region in which the emitter region 12 and the contact region 15 are formed, the accumulation region 16 may be formed to overlap them. However, as shown in FIG. 1, at least a part of the contact region 15 closest to the well region 11 may not be covered with the accumulation region 16. In this way, the holes accumulated in the edge region positioned outside the contact region 15 (in the present example, positioned on the negative side in the X-axis direction) can be easily extracted out.

Figure 12:
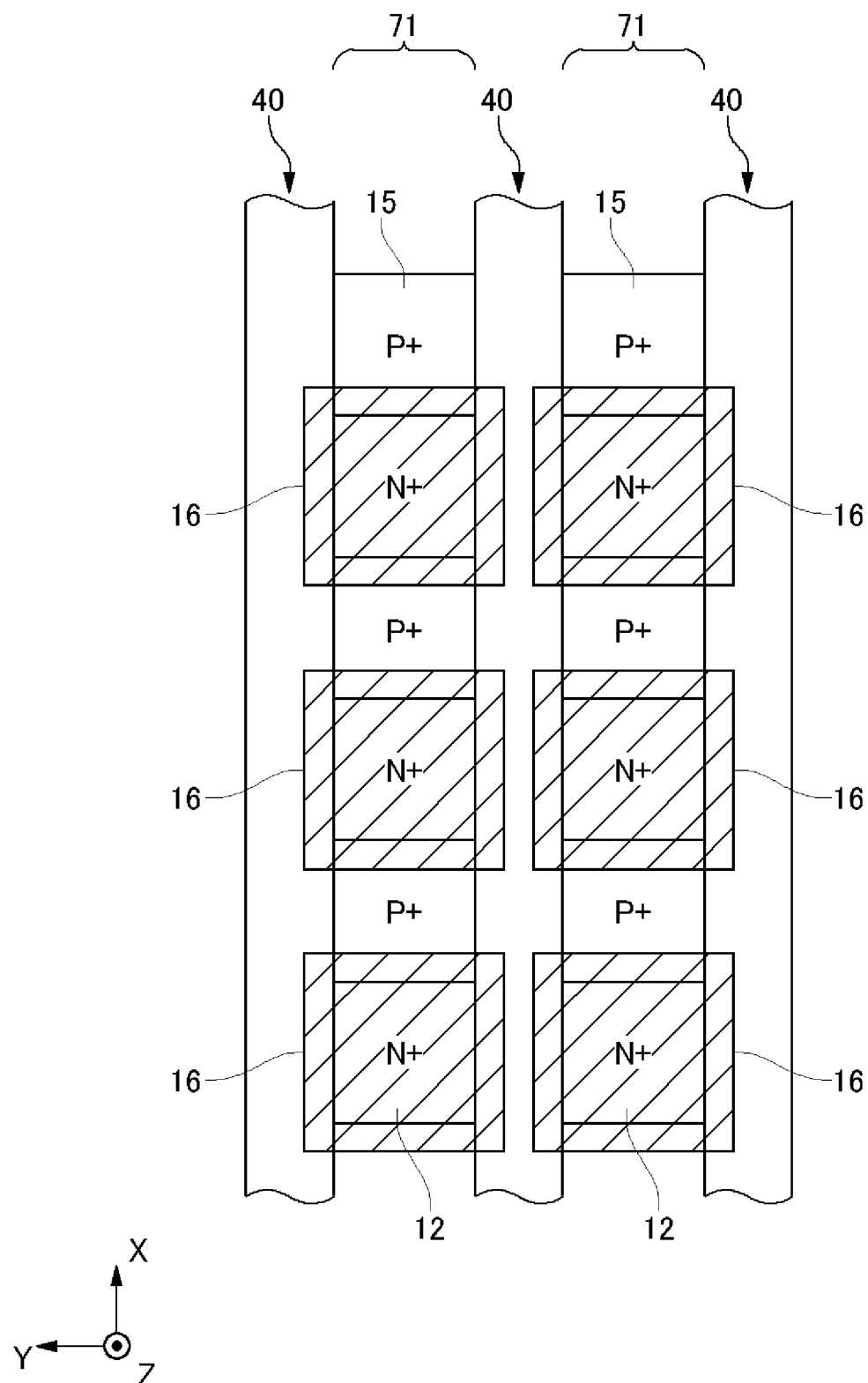
FIG. 12 is a top view showing an arrangement example of an accumulation region 16 and a carrier passage region 17.

In an example of FIG. 12, the carrier passage regions 17 are arranged in a lattice pattern in the XY plane. For example, each carrier passage region 17 has a portion overlapping the trench portion and a portion overlapping the mesa portion 71. In the example of FIG. 12, the carrier passage region 17 (that is, the region not provided with the accumulation region 16) has a portion overlapping at least a part of the contact region 15. That is, the carrier passage region 17 is also provided below at least a portion of the contact region 15. In this case, at least a portion of the base region 14 below the contact region 15 is not covered with the accumulation region 16. This portion of the carrier passage region 17 is formed continuously from one trench portion to an adjacent trench portion. In this case, the accumulation region 16 may be arranged to overlap the entire emitter region 12. Such a structure can facilitate the extraction of the carriers.

Figure 13:
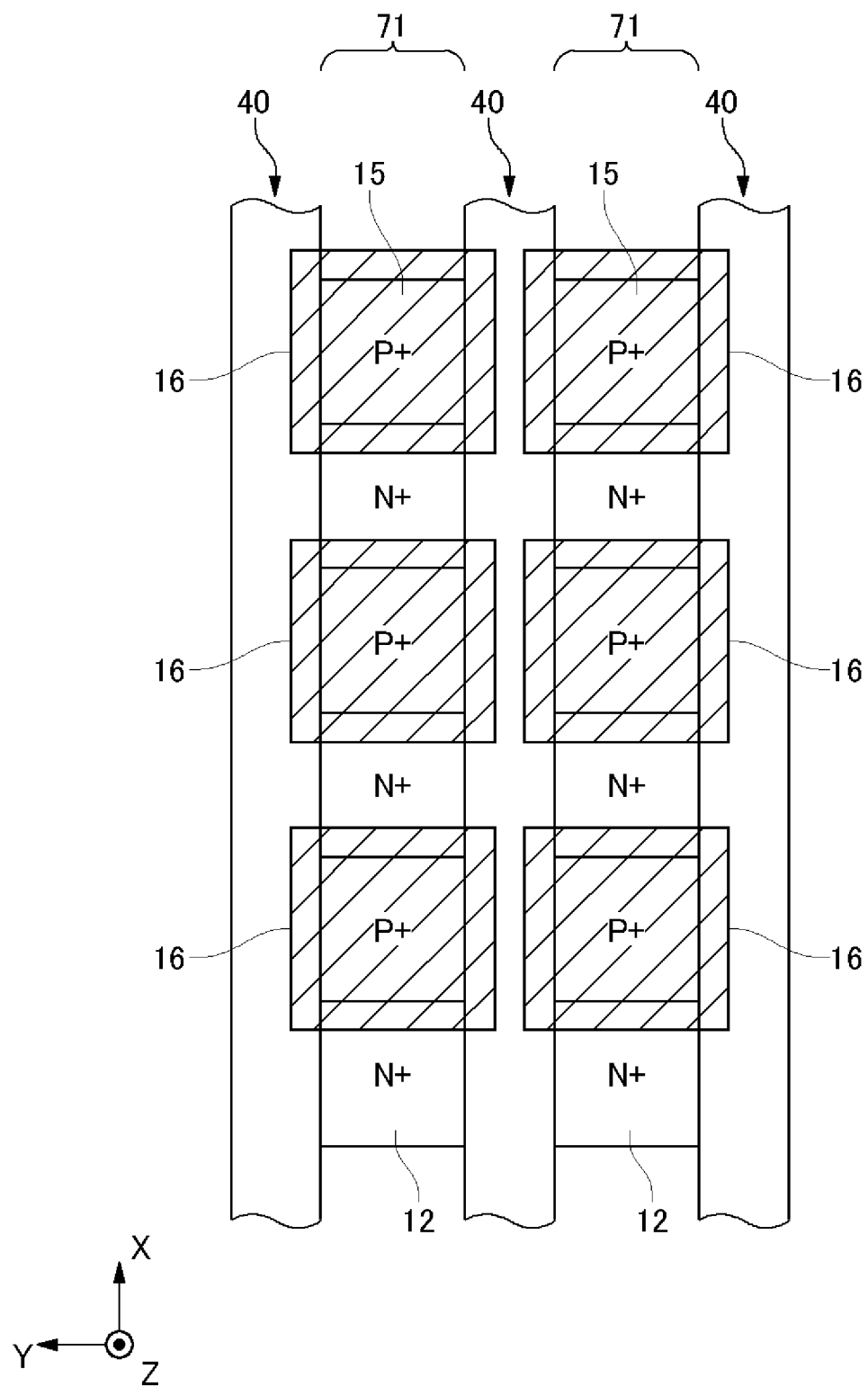
FIG. 13 is a top view showing an arrangement example of the accumulation region 16 and the carrier passage region 17.

In an example of FIG. 13, the carrier passage regions 17 are arranged in a lattice shape on the XY plane. In the example of FIG. 13, the carrier passage region 17 (that is, the region not provided with the accumulation region 16) has a portion overlapping at least a part of the emitter region 12. That is, the carrier passage region 17 is also provided below at least a portion of the emitter region 12. In this case, at least a portion of the base region 14 below the emitter region 12 is not covered with the accumulation region 16. That portion of the carrier passage region 17 is formed continuously from one trench portion to an adjacent trench portion. In this case, the accumulation region 16 may be arranged to overlap the entire contact region 15. With such a structure, accumulation of carriers can be facilitated as compared to the example of FIG. 12.

Figure 14:
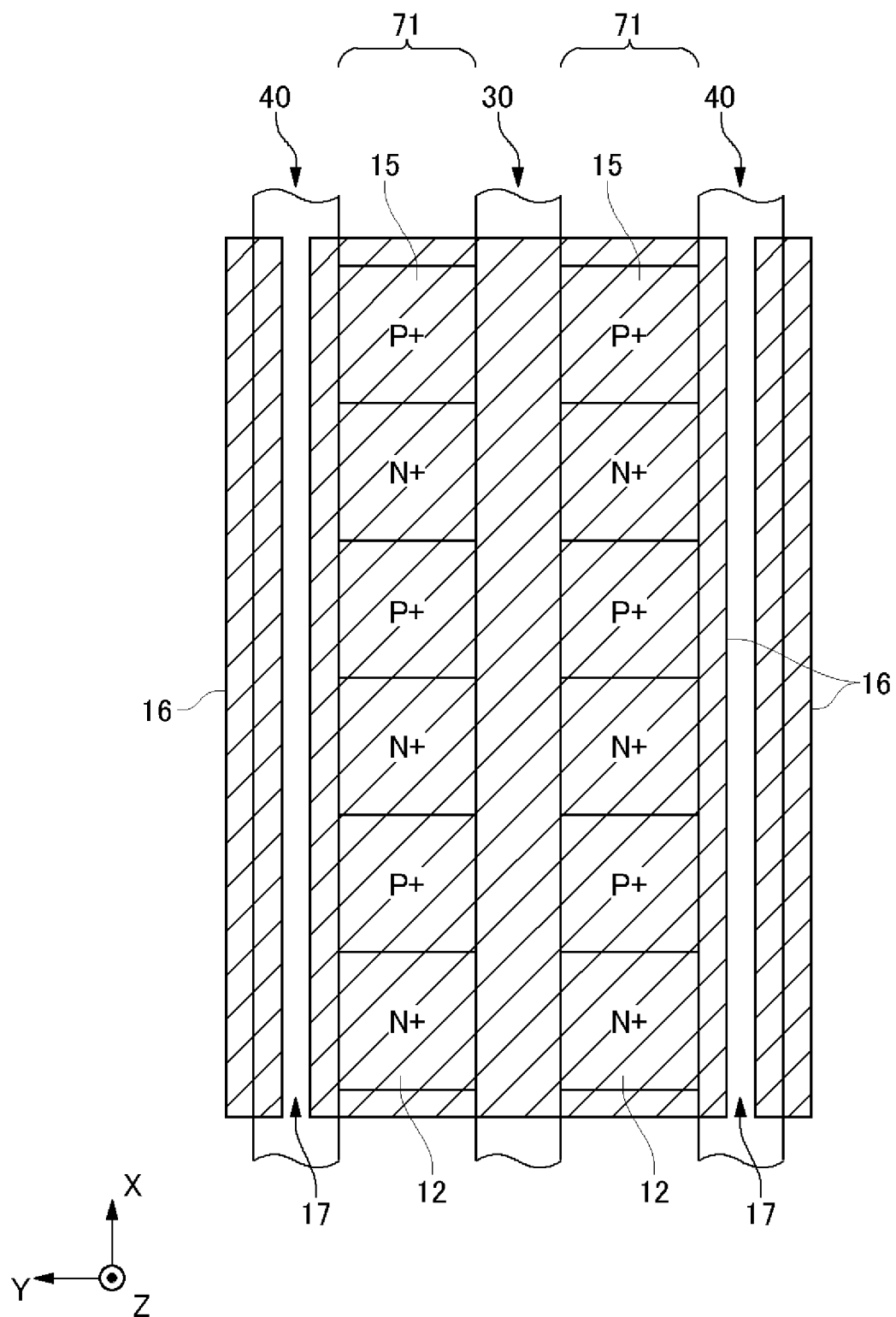
FIG. 14 is a top view showing an arrangement example of the accumulation region 16 and the carrier passage region 17.

In an example of FIG. 14, the carrier passage regions 17 are arranged to overlap the gate trench portion 40. The carrier passage regions 17 may be arranged to form a straight line in parallel to the gate trench portion 40. Here, no carrier passage regions 17 are arranged at the portions overlapping the dummy trench portion 30. That is, no carrier passage regions 17 are provided between the dummy trench portion 30 and the accumulation region 16. The dummy trench portion 30 may be connected to or separated from the accumulation region 16. Such a structure can accomplish both of the enhanced carrier accumulation effect in the area below the dummy trench portion 30 and the carrier extraction in the area below the gate trench portion 40.

The accumulation region 16 may be formed continuously from below a gate trench portion 40 to below a different gate trench portion 40 across the dummy trench portion 30 positioned therebetween. Also, as shown in FIG. 12 or FIG. 13, the carrier passage region 17 may be formed at an area below the emitter region 12, or below the contact region 15.

Figure 15:
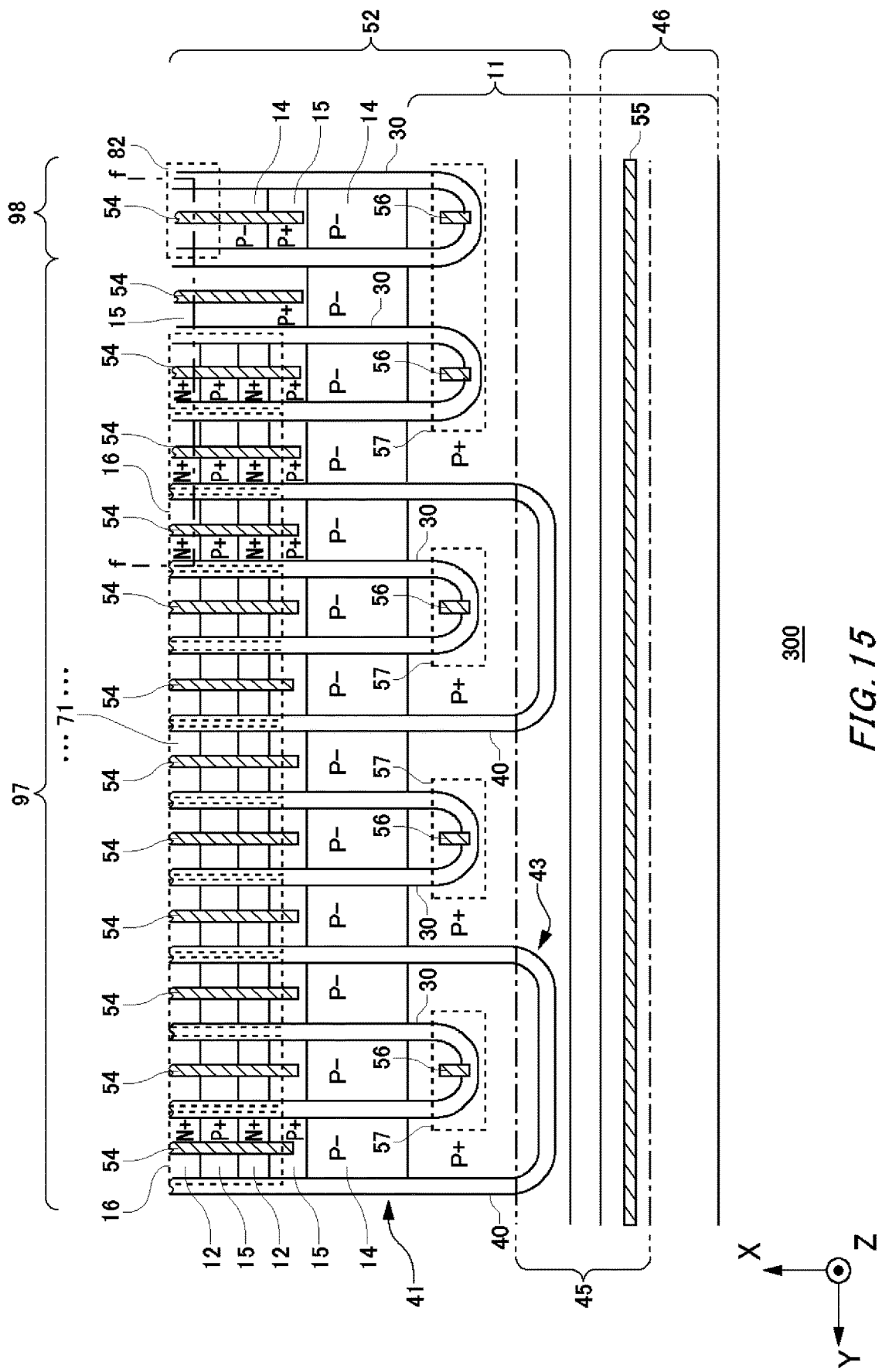
FIG. 15 shows a part of an upper surface of a semiconductor device 300 according to an embodiment in the present invention.

FIG. 15 shows a part of an upper surface of a semiconductor device 300 according to an embodiment in the present invention. The semiconductor device 300 comprises a transistor portion 97 and a diode portion 98 provided in the semiconductor substrate 10. A structure of the transistor portion 97 is the same as that of the semiconductor device 100 or the semiconductor device 200 illustrated in FIG. 1 to FIG. 14. The diode portion 98 is provided adjacent to the transistor portion 97 at the upper surface of the semiconductor substrate 10, and includes a diode such as FWD (Free Wheel Diode).

In the diode portion 98, the plurality of dummy trench portions 30 are arranged successively. In the mesa portion 71 of the diode portion 98, the emitter region 12 is not formed. Also, in the mesa portion 71 of the diode portion 98, the contact region 15 is formed in a region facing at least one contact region 15 in the transistor portion 97.

In the present example, the contact region 15 of the diode portion 98 faces the last one of the contact regions 15 that are next to each other in the X-axis direction in the transistor portion 97. At the upper surface of the mesa portion 71 of the diode portion 98, the base region 14 may be exposed in the region other than the contact region 15. Note that, from among the mesa portions 71 of the transistor portion 97, in the mesa portion 71 that is adjacent to the diode portion 98, the contact region 15 may be provided in place of the emitter region 12. That is, the mesa portion 71 at the boundary may have the contact regions 15 continuously arranged in a given region thereof, while the other mesa portions 71 of transistor portion 97 have the contact regions 15 and the emitter regions 12 arranged alternately in the corresponding region thereof.

In the diode portion 98, the contact hole 54 is formed above the contact region 15 and the base region 14. The contact hole 54 of the present example is not formed in the base region 14 closest to the gate metal layer 46 among the plurality of base regions 14 in the mesa portion 71 of the diode portion 98.

Among the mesa portions 71 of the transistor portion 97, in the mesa portion 71 arranged at the boundary with the diode portion 98, the contact hole 54 may be formed above the contact region 15. The contact hole 54 of the present example is not formed in the base region 14 of the mesa portion 71 at the boundary. In the present example, the contact hole 54 of the transistor portion 97 and the contact hole 54 of diode portion 98 has the same length in the extending direction of each trench portion (X-axis direction).

In the diode portion 98, a cathode region 82 of the first conductivity type is provided in a region in direct contact with the lower surface of the semiconductor substrate 10. The cathode region 82 of the present example is an N+ type region having a higher doping concentration than the drift region 18. In FIG. 15, the cathode region 82 is shown by a dashed line. As one example, the diode portion 98 is the region overlapping the cathode region 82 in the direction perpendicular to the lower surface of the semiconductor substrate 10. Also, the transistor portion 97 is the region in which predetermined unit structures each including the emitter region 12 and the contact region 15 are arranged regularly, where such region is a part of the region overlapping the collector region 22 in the direction perpendicular to the lower surface of the semiconductor substrate 10.

Figure 16A:
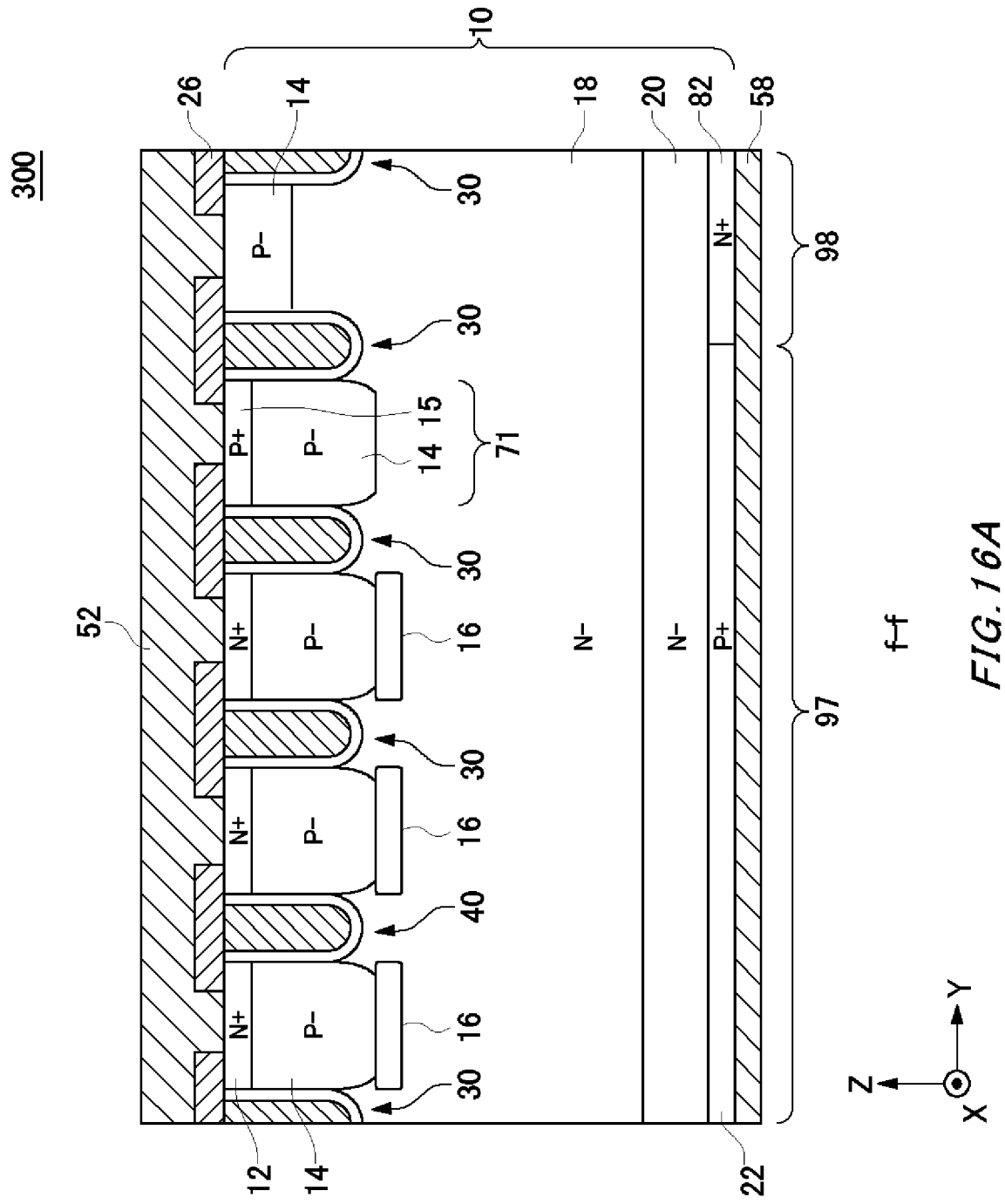
FIG. 16A shows one example in a cross-section f-f in FIG. 15.

FIG. 16A shows one example in a cross-section f-f in FIG. 15. The cross-section f-f of the present example is the YZ plane that passes through the emitter region 12. The transistor portion 97 shown in FIG. 16A has a similar structure to the semiconductor device 100 shown in FIG. 2A. However, among the mesa portions 71 of the transistor portion 97, in the mesa portion 71 adjacent to the diode portion 98, the contact region 15 may be provided in place of the emitter region 12. Also, among the mesa portions 71 of the transistor portion 97, in the mesa portion 71 adjacent to the diode portion 98, the accumulation region 16 is not provided. The drift region 18 that serves as the carrier passage region 17 is provided below the mesa portion 71.

Such a structure makes it easier to extract the holes in the drift region 18 through the mesa portion 71 at the boundary. Accordingly, at turn-off or the like in the transistor portion 97, it can be suppressed that holes in the drift region 18 of the diode portion 98 flow in the transistor portion 97. In the examples of FIG. 15 and FIG. 16A, one mesa portion 71 at the boundary has the contact region 15 in place of the emitter region 12, and does not have the accumulation region 16; however, in another example, the plurality of mesa portions 71 at the boundary may have that configuration. Note that on a lower surface side of the mesa portion 71 adjacent to the diode portion 98 in the transistor portion 97, the cathode region 82 may be provided in place of the collector region 22.

The diode portion 98 of the present example has one or more dummy trench portions 30, the drift region 18, the base region 14, the buffer region 20 and the cathode region 82. The cathode region 82 is provided in a region in direct contact with the lower surface of the semiconductor substrate 10. The cathode region 82 of the present example is provided between the buffer region 20 and the lower surface of the semiconductor substrate 10. The cathode region 82 may be provided at the same depth position as that of the collector region 22.

In a cross-section shown in FIG. 16A, in the base region 14 is provided in the mesa portion 71 of the diode portion 98. In the mesa portion 71 of the diode portion 98 of the present example, the accumulation region 16 is not provided. That is, in the diode portion 98, the accumulation region 16 having a higher doping concentration than the drift region 18 is not provided between the base region 14 and the drift region 18. The base region 14 of the diode portion 98 may be provided shallower than the base region 14 of the transistor portion 97.

With such a structure, in the semiconductor device 300 in which the transistor portion 97 and the diode portion 98 are provided in the same semiconductor substrate 10, while the carrier accumulation effect can be maintained in the vicinity of the lower end of the gate trench portion 40, the carriers can be extracted efficiently at turn-off or the like. For this reason, the on-voltage and the turn-off loss of the semiconductor device 300 can be improved and, at the same time, the destructive breakdown withstand capability can be improved.

Figure 16B:
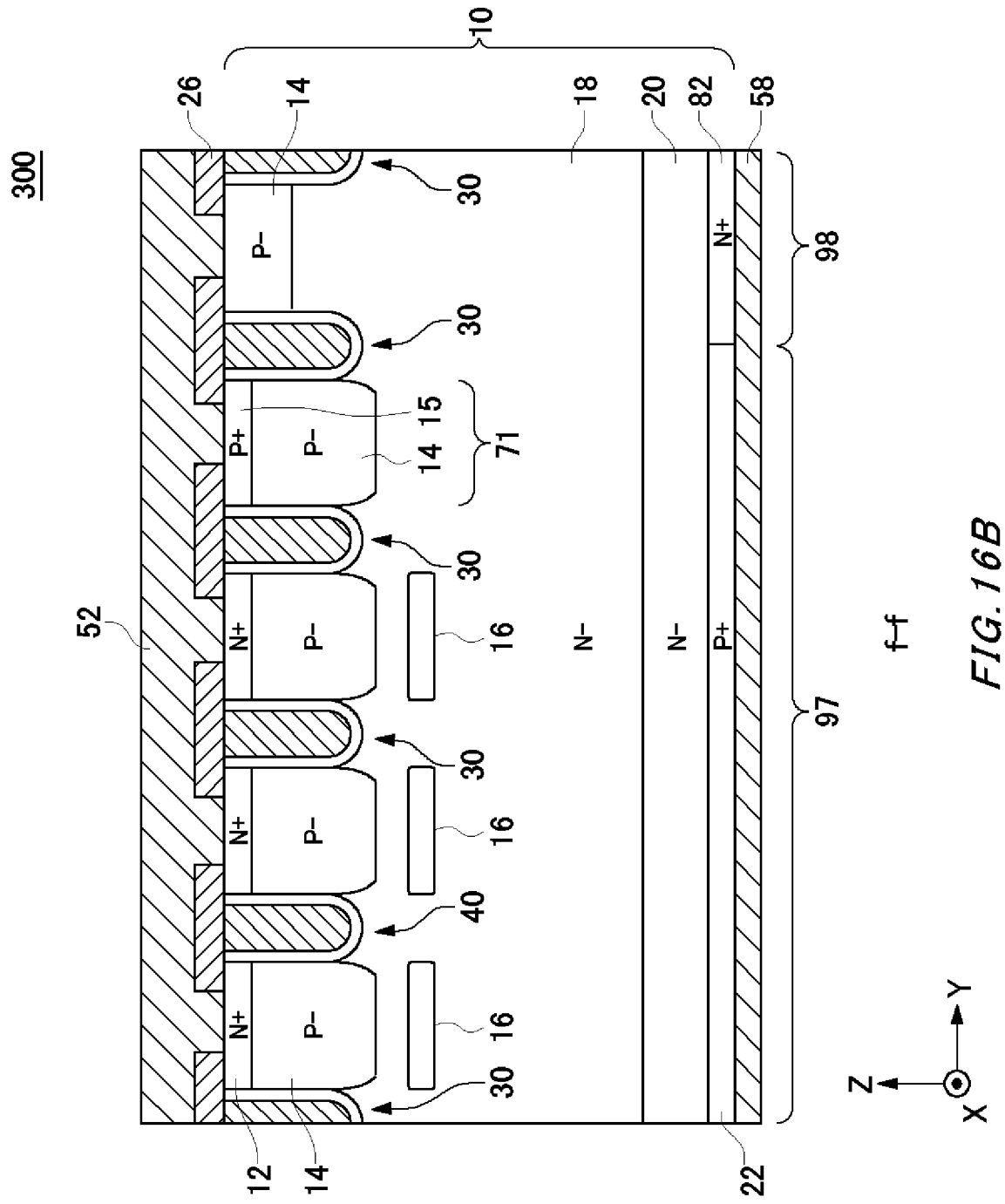
FIG. 16B shows another example in the cross-section f-f in FIG. 15.

FIG. 16B shows another example in the cross-section f-f in FIG. 15. The present example is similar to the example of FIG. 16A except that the accumulation region 16 is separated from the base region 14. A distance between the accumulation region 16 and the base region 14 is similar to that in the example illustrated in FIG. 3C and FIG. 3D.

Figure 17A:
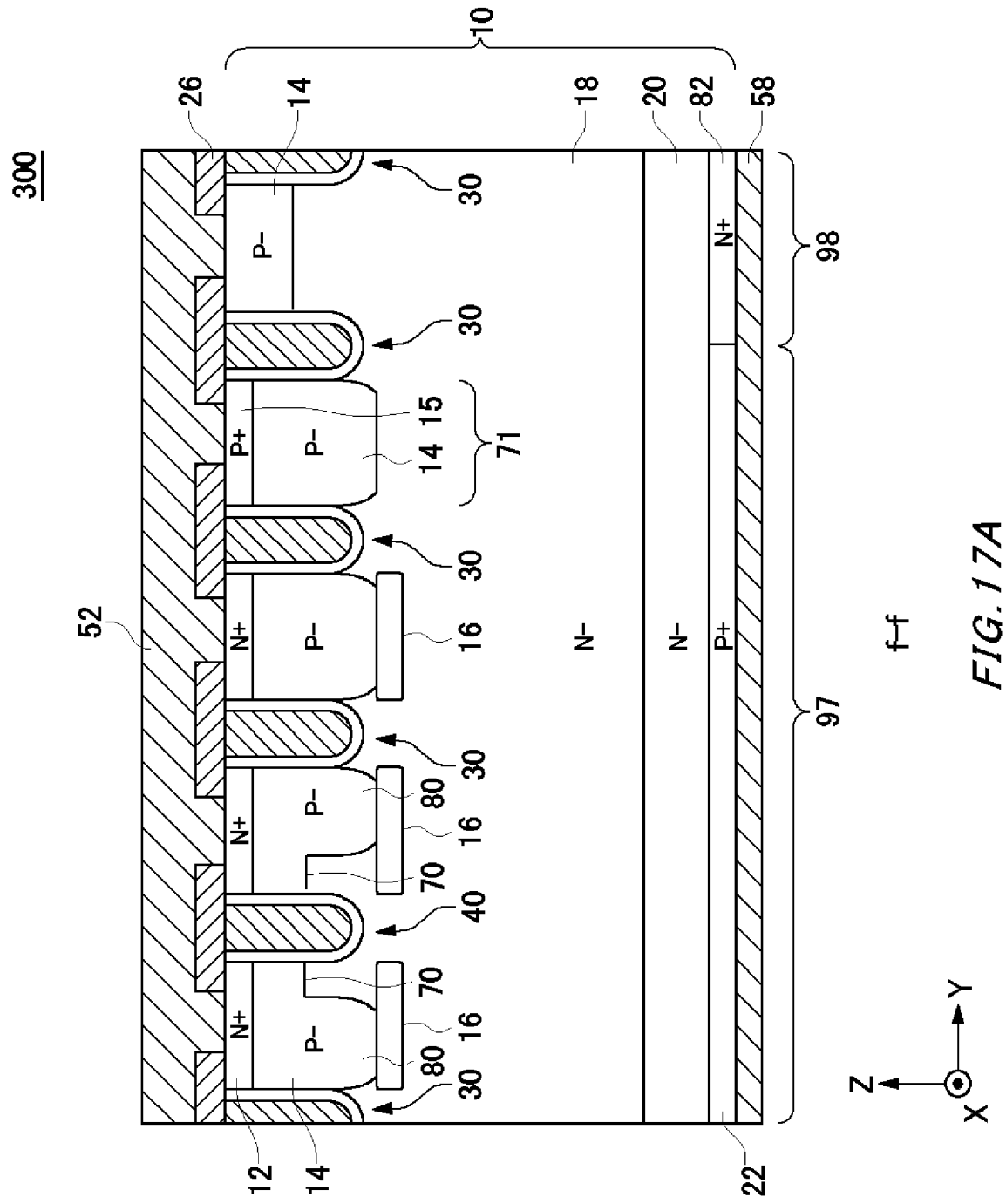
FIG. 17A shows another example in the cross-section f-f in FIG. 15.

FIG. 17A shows another example in the cross-section f-f in FIG. 15. The transistor portion 97 shown in FIG. 17A has a similar structure to the semiconductor device 100 shown in FIG. 5A. That is, the base region 14 of the mesa portion 71 in the transistor portion 97 has the gate adjacent region 70 in direct contact with the gate trench portion 40, and the dummy adjacent region 80 in direct contact with the dummy trench portion 30.

As shown in FIG. 17A, the gate adjacent region 70 is provided on both sides of the gate trench portion 40 in the Y-axis direction. Also, the gate adjacent region 70 is not provided in the mesa portion 71 sandwiched by the dummy trench portions 30. Also, the base region 14 of the mesa portion 71 in the diode portion 98 may have a mostly uniform depth at each position in the Y-axis direction.

Also in the present example, among the mesa portions 71 of the transistor portion 97, in the mesa portion 71 adjacent to the diode portion 98, the accumulation region 16 is not provided. The drift region 18 that serves as the carrier passage region 17 is provided below the mesa portion 71.

Such a structure makes it easier to extract the holes in the drift region 18 through the mesa portion 71 at the boundary. Accordingly, at turn-off or the like in the transistor portion 97, it can be suppressed that holes at the drift region 18 in the diode portion 98 flow in the transistor portion 97.

Figure 17B:
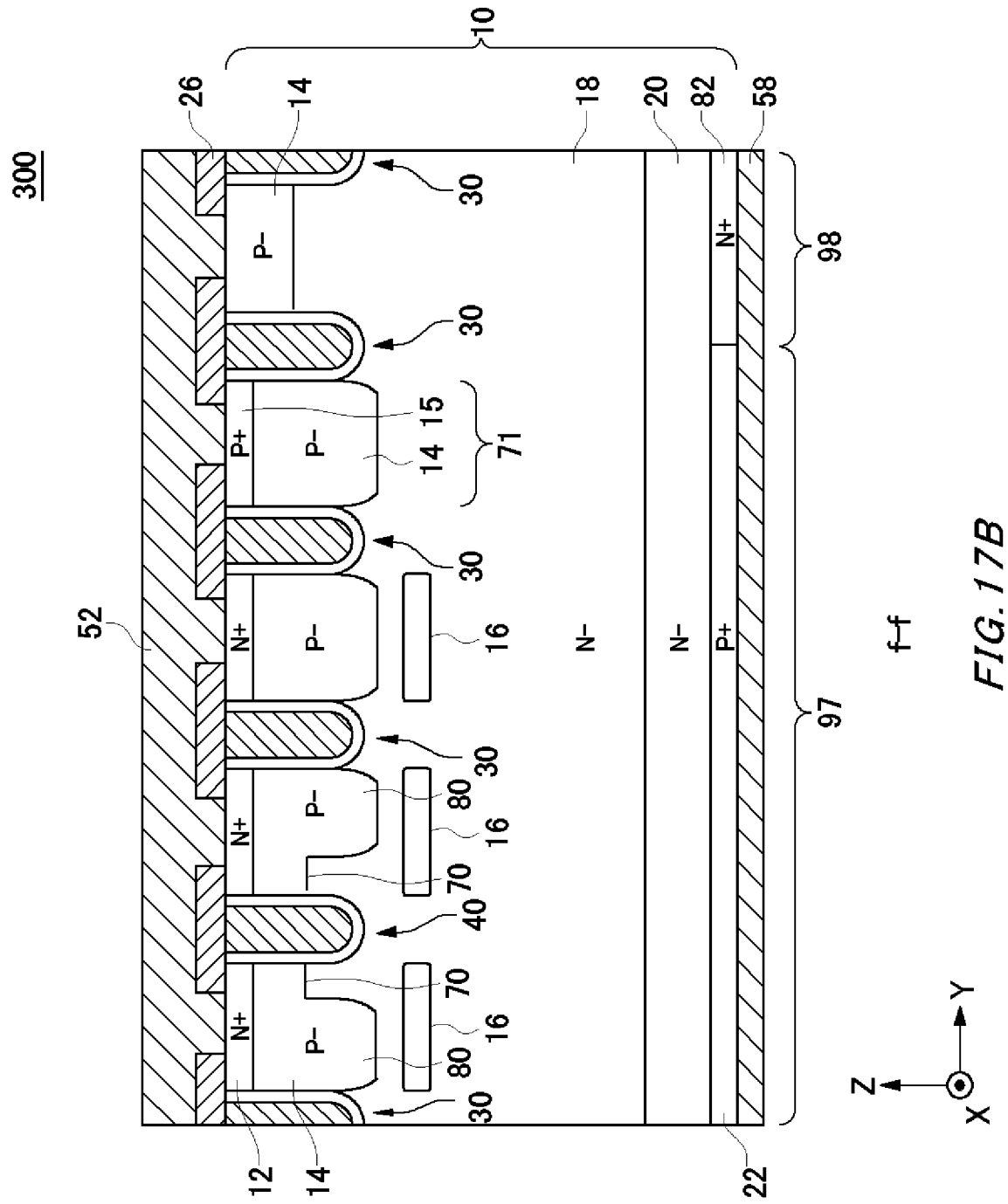
FIG. 17B shows another example in the cross-section f-f in FIG. 15.

FIG. 17B shows another example in the cross-section f-f in FIG. 15. The present example is similar to the example of FIG. 17A except that the accumulation region 16 is separated from the base region 14. A distance between the accumulation region 16 and the base region 14 is similar to that in the example illustrated in FIG. 3C and FIG. 3D.

Figure 18A:
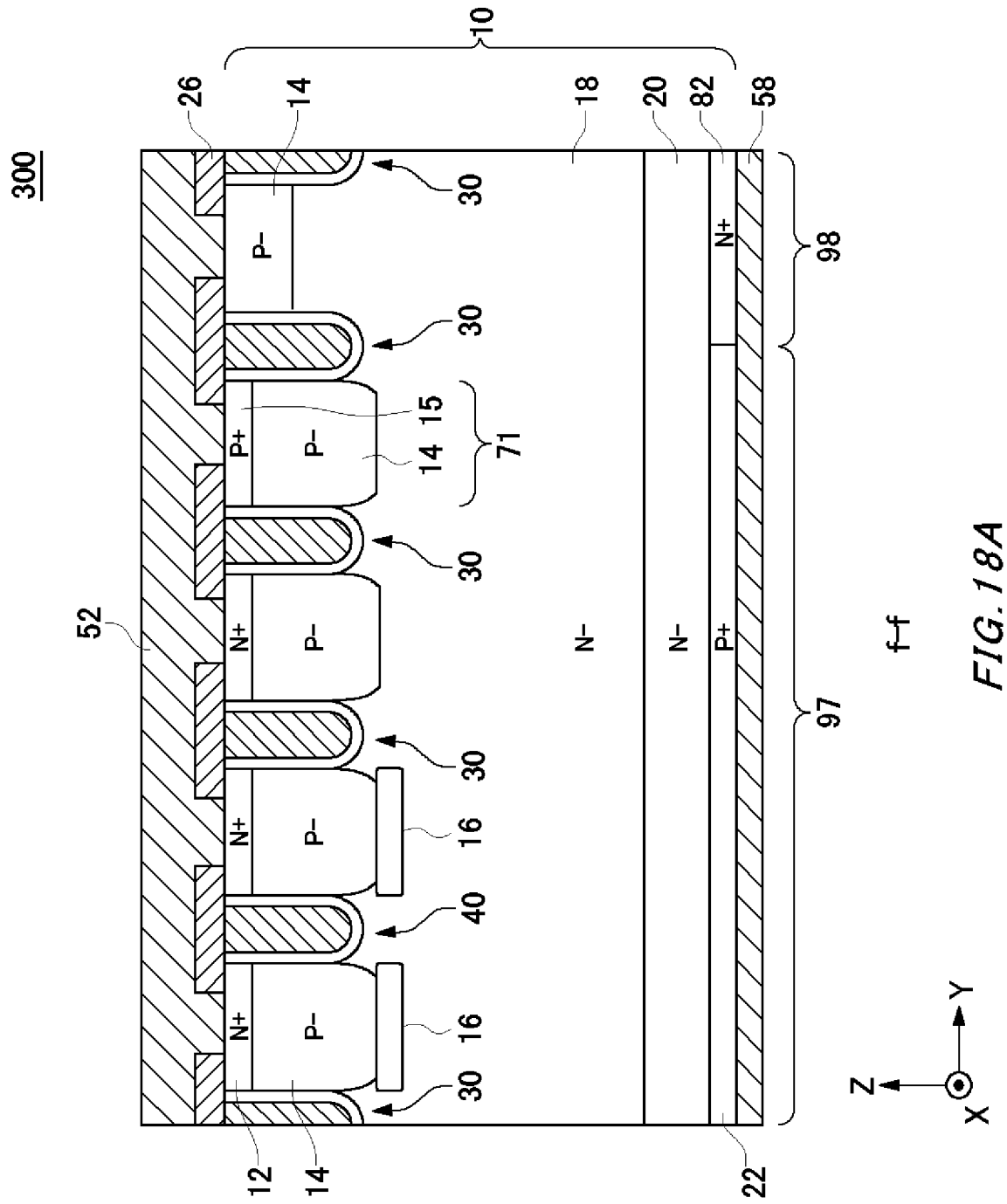
FIG. 18A shows another example in the cross-section f-f in FIG. 15.

FIG. 18A shows another example in the cross-section f-f in FIG. 15. The transistor portion 97 shown in FIG. 18A has a similar structure to the transistor portion 97 shown in FIG. 16A. However, in the transistor portion 97 of the present example, the accumulation region 16 is not provided in the mesa portion 71 sandwiched by the dummy trench portions 30. The drift region 18 that serves as the carrier passage region 17 is provided below the mesa portion 71 sandwiched by the dummy trench portions 30. The diode portion 98 is the same as the diode portion 98 shown in FIG. 16A.

Such a structure can make it further easier to extract the carriers at turn-off or the like in the semiconductor device 300. Note that in the cross-section shown in FIG. 18A, the emitter region 12 is arranged on an upper surface side of the mesa portion 71 sandwiched by the dummy trench portions 30 in the transistor portion 97, while the contact region 15 is in direct contact with the emitter region 12 in the X-axis direction. The carriers that exist below the emitter region 12 are extracted to the contact region 15 through a lower side of the emitter region 12.

Also in the present example, among the mesa portions 71 in the transistor portion 97, in the mesa portion 71 adjacent to the diode portion 98, the accumulation region 16 is not provided. The drift region 18 that serves as the carrier passage region 17 is provided below the mesa portion 71.

Such a structure makes it easier to extract the holes in the drift region 18 through the mesa portion 71 at the boundary. Accordingly, at turn-off or the like in the transistor portion 97, it can be suppressed that holes at the drift region 18 in the diode portion 98 flow in the transistor portion 97.

Figure 18B:
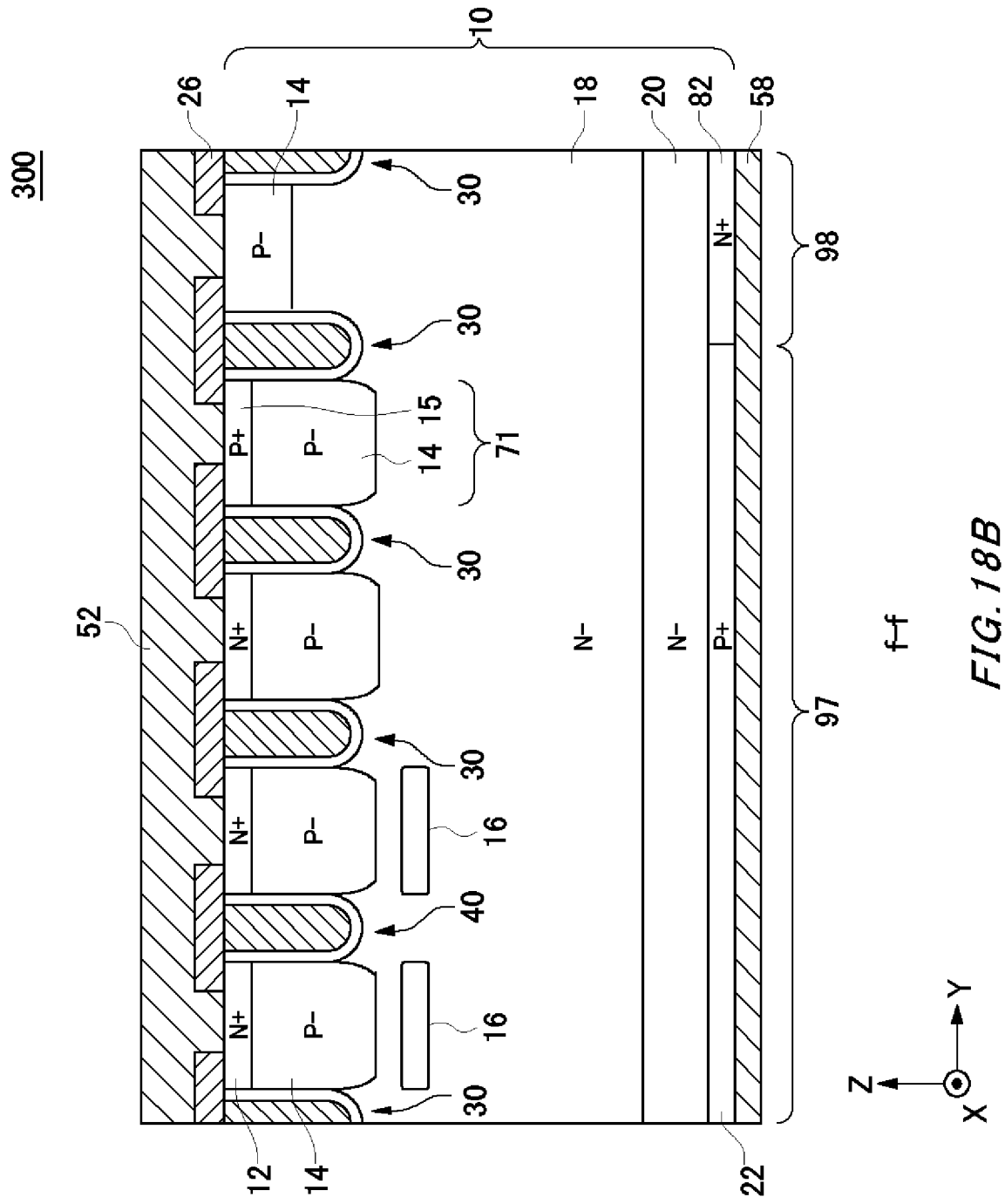
FIG. 18B shows another example in the cross-section f-f in FIG. 15.

FIG. 18B shows another example in the cross-section f-f in FIG. 15. The present example is similar to the example of FIG. 18A except that the accumulation region 16 is separated from the base region 14. A distance between the accumulation region 16 and the base region 14 is similar to that in the example illustrated in FIG. 3C and FIG. 3D.

Figure 19A:
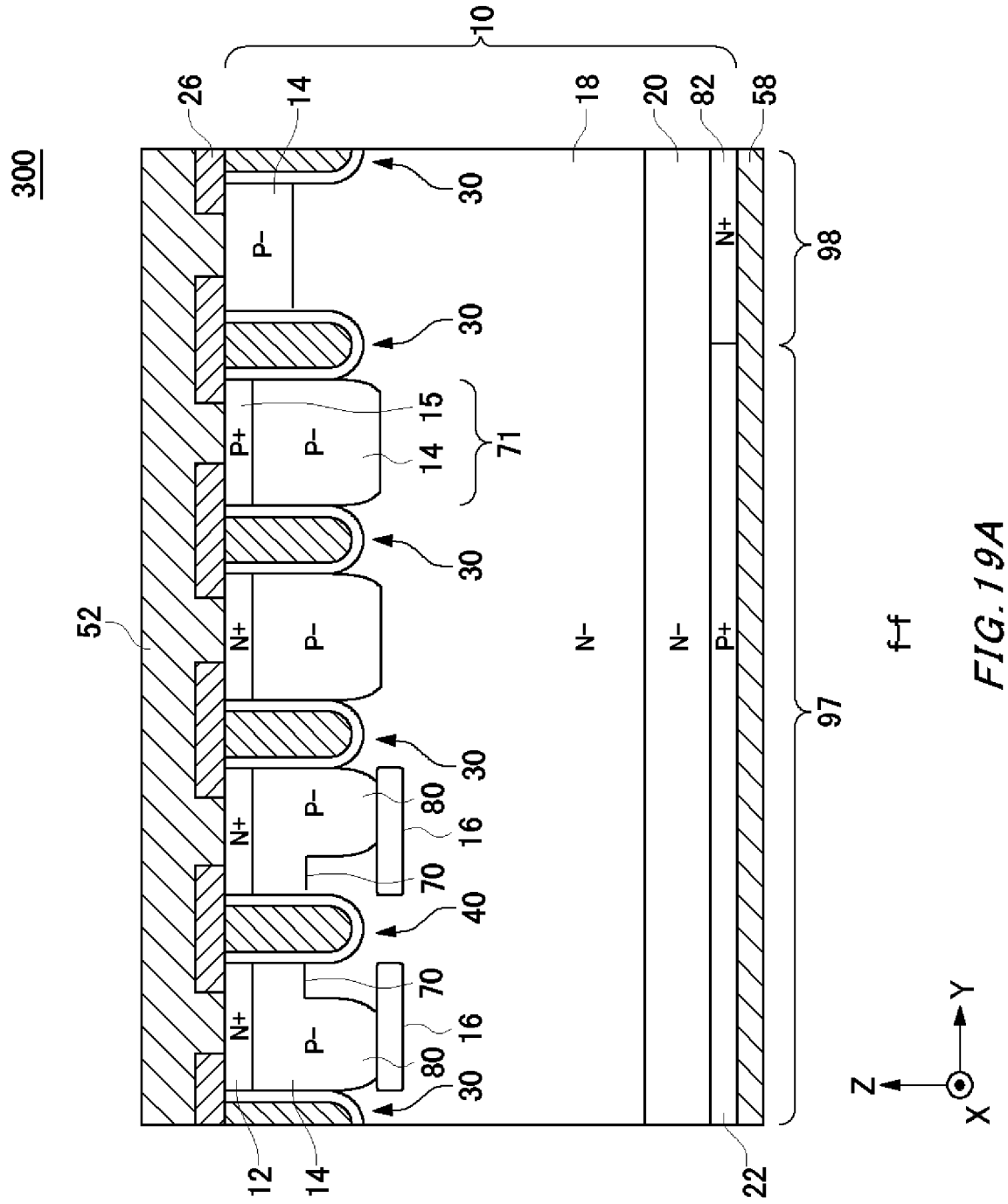
FIG. 19A shows another example in the cross-section f-f in FIG. 15.

FIG. 19A shows another example in the cross-section f-f in FIG. 15. The transistor portion 97 shown in FIG. 19A has a similar structure to the transistor portion 97 shown in FIG. 17A. However, in the transistor portion 97 of the present example, the accumulation region 16 is not provided in the mesa portion 71 sandwiched by the dummy trench portions 30. The diode portion 98 is the same as the diode portion 98 shown in FIG. 17A. Such a structure can make it further easier to extract the carriers at turn-off or the like in the semiconductor device 300.

Also in the present example, among the mesa portions 71 in the transistor portion 97, in the mesa portion 71 adjacent to the diode portion 98, the accumulation region 16 is not provided. The drift region 18 that serves as the carrier passage region 17 is provided below the mesa portion 71.

Such a structure makes it easy to extract the holes in the drift region 18 through the mesa portion 71 at the boundary. Accordingly, at turn-off or the like in the transistor portion 97, it can be suppressed that holes at the drift region 18 in the diode portion 98 flow in the transistor portion 97.

Figure 19B:
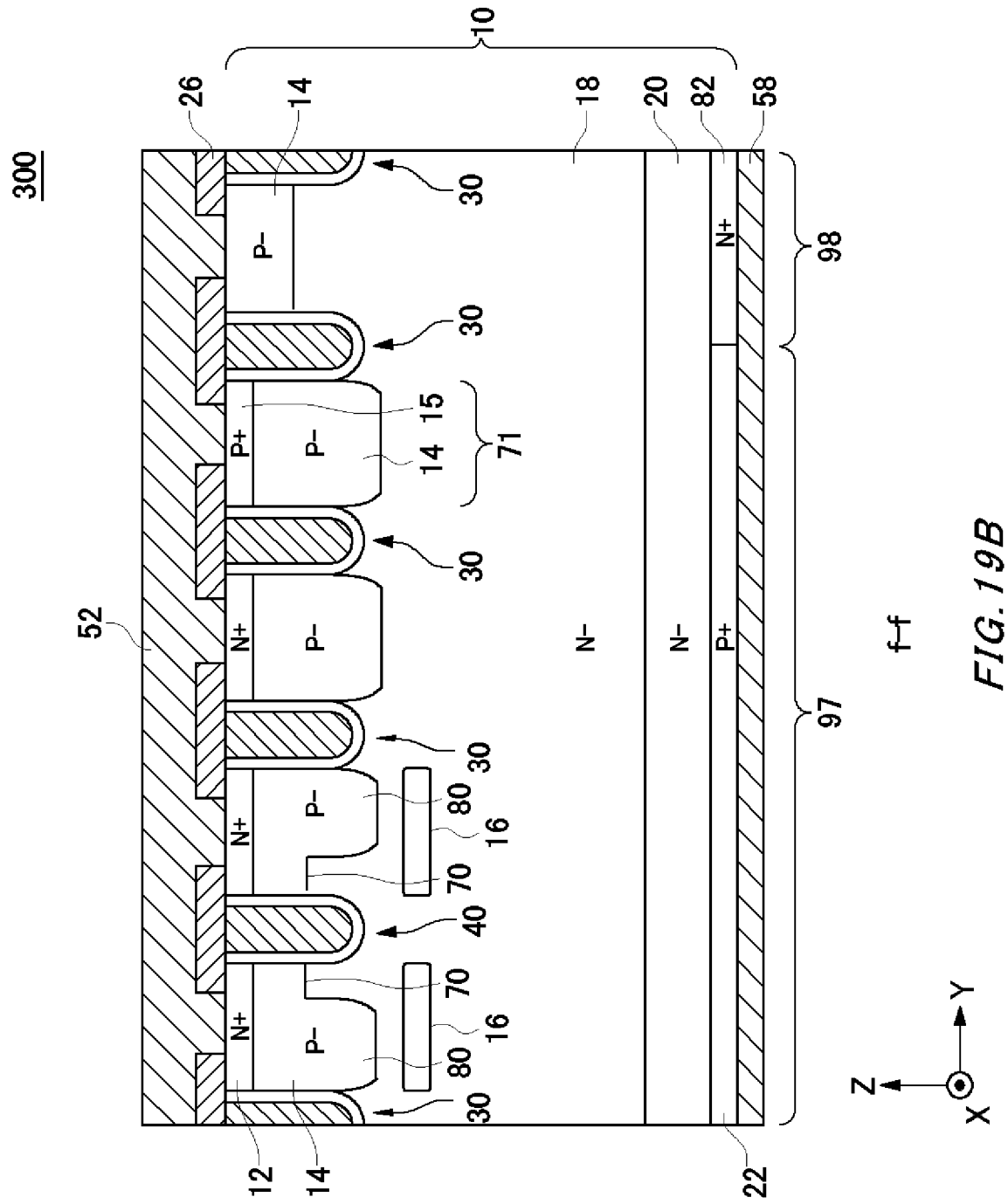
FIG. 19B shows another example in the cross-section f-f in FIG. 15.

FIG. 19B shows another example in the cross-section f-f in FIG. 15. The present example is similar to the example of FIG. 19A except that the accumulation region 16 is separated from the base region 14. A distance between the accumulation region 16 and the base region 14 is similar to that in the example illustrated in FIG. 3C and FIG. 3D.

While the embodiments of the present invention have been described above, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
a semiconductor substrate including a first-conductivity-type drift region;
a second-conductivity-type base region provided above the drift region inside the semiconductor substrate;
an accumulation region provided between the drift region and a lower surface of the base region inside the semiconductor substrate, the accumulation region having a lower second-conductivity-type carrier mobility than the drift region and the base region;
a plurality of trench portions arrayed at an upper surface of the semiconductor substrate and provided from the upper surface of the semiconductor substrate to an inside of the semiconductor substrate, the plurality of trench portions including at least one gate trench portion being in contact with the base region;
a carrier passage region occupying at least a partial region between the accumulation region and the at least one gate trench portion inside the semiconductor substrate, the carrier passage region having a higher second-conductivity-type carrier mobility than the accumulation region;
a first-conductivity-type emitter region formed above the base region inside the semiconductor substrate, and having a higher doping concentration than the drift region; and
a mesa portion that is sandwiched by the plurality of trench portions and is in contact with the at least one gate trench portion, wherein
the emitter region and the base region are provided within the mesa portion,
the base region extends downward beyond a lower end of the at least one gate trench portion in the mesa portion,
in the mesa portion, the accumulation region is positioned lower than the lower end of the at least one gate trench portion and in contact with the base region below the emitter region, and
a width of the accumulation region in an array direction of the plurality of trench portions is equal to or larger than a width of the mesa portion.

2. The semiconductor device according to claim 1, wherein
the accumulation region is a first-conductivity-type region having a higher doping concentration than the drift region.

3. A semiconductor device comprising:
a semiconductor substrate including a first-conductivity-type drift region;
a second-conductivity-type base region provided above the drift region inside the semiconductor substrate;
an accumulation region provided between the drift region and a lower surface of the base region inside the semiconductor substrate, the accumulation region having a lower second-conductivity-type carrier mobility than the drift region and the base region;
a gate trench portion provided from an upper surface of the semiconductor substrate to an inside of the semiconductor substrate, the gate trench portion being in contact with the base region;
a carrier passage region occupying at least a partial region between the accumulation region and the gate trench portion inside the semiconductor substrate, the carrier passage region having a higher second-conductivity-type carrier mobility than the accumulation region; and
a mesa portion in contact with the gate trench portion, wherein
the base region is provided within the mesa portion and extends downward beyond a lower end of the gate trench portion in the mesa portion,
in the mesa portion, the accumulation region is positioned lower than the lower end of the gate trench portion, and
the accumulation region includes at least one type of high resistance region selected from among an oxide region, a nitride region and a carbide region.

4. The semiconductor device according to claim 1, wherein
the carrier passage region is a part of the drift region.

5. A semiconductor device comprising:
a semiconductor substrate including a first-conductivity-type drift region;
a second-conductivity-type base region provided above the drift region inside the semiconductor substrate;
an accumulation region provided between the drift region and a lower surface of the base region inside the semiconductor substrate, the accumulation region having a lower second-conductivity-type carrier mobility than the drift region and the base region;
a gate trench portion provided from an upper surface of the semiconductor substrate to an inside of the semiconductor substrate, the gate trench portion being in contact with the base region;
a carrier passage region occupying at least a partial region between the accumulation region and the gate trench portion inside the semiconductor substrate, the carrier passage region having a higher second-conductivity-type carrier mobility than the accumulation region; and
a mesa portion in contact with the gate trench portion, wherein
the base region is provided within the mesa portion and extends downward beyond a lower end of the gate trench portion in the mesa portion,
in the mesa portion, the accumulation region is positioned lower than the lower end of the gate trench portion, and
the accumulation region is provided to overlap the entire base region.

6. The semiconductor device according to claim 5, wherein
the accumulation region is provided to additionally overlap a part of a lower surface of the gate trench portion.

7. A semiconductor device comprising:
a semiconductor substrate including a first-conductivity-type drift region;

a second-conductivity-type base region provided above the drift region inside the semiconductor substrate;

an accumulation region provided between the drift region and a lower surface of the base region inside the semiconductor substrate, the accumulation region having a lower second-conductivity-type carrier mobility than the drift region and the base region;

a gate trench portion provided from an upper surface of the semiconductor substrate to an inside of the semiconductor substrate, the gate trench portion being in contact with the base region;

a carrier passage region occupying at least a partial region between the accumulation region and the gate trench portion inside the semiconductor substrate, the carrier passage region having a higher second-conductivity-type carrier mobility than the accumulation region;

a mesa portion in contact with the gate trench portion; and a dummy trench portion provided from the upper surface of the semiconductor substrate to the inside of the semiconductor substrate, the dummy trench portion being in contact with the base region, wherein the base region is provided within the mesa portion and extends downward beyond a lower end of the gate trench portion in the mesa portion, in the mesa portion, the accumulation region is positioned lower than the lower end of the gate trench portion, and no carrier passage region is provided between the dummy trench portion and the accumulation region.

8. A semiconductor device comprising:
a semiconductor substrate including a first-conductivity-type drift region;
a second-conductivity-type base region provided above the drift region inside the semiconductor substrate;
an accumulation region provided between the drift region and a lower surface of the base region inside the semiconductor substrate, the accumulation region having a lower second-conductivity-type carrier mobility than the drift region and the base region;
a gate trench portion provided from an upper surface of the semiconductor substrate to an inside of the semiconductor substrate, the gate trench portion being in contact with the base region;
a carrier passage region occupying at least a partial region between the accumulation region and the gate trench portion inside the semiconductor substrate, the carrier passage region having a higher second-conductivity-type carrier mobility than the accumulation region;
a mesa portion in contact with the gate trench portion; and
a dummy trench portion provided from the upper surface of the semiconductor substrate to the inside of the semiconductor substrate, wherein
the base region is provided within the mesa portion and extends downward beyond a lower end of the gate trench portion in the mesa portion,
in the mesa portion, the accumulation region is positioned lower than the lower end of the gate trench portion,
the mesa portion is sandwiched between the gate trench portion and the dummy trench portion,
the base region is provided in the mesa portion and in direct contact with both of the dummy trench portion and the gate trench portion, and
the base region in direct contact with the dummy trench portion in the mesa portion extends, from the upper surface of the semiconductor substrate, deeper than the base region in direct contact with the gate trench portion in the mesa portion.

9. A semiconductor device comprising:
a semiconductor substrate including a first-conductivity-type drift region;
a second-conductivity-type base region provided above the drift region inside the semiconductor substrate;
an accumulation region provided between the drift region and a lower surface of the base region inside the semiconductor substrate, the accumulation region having a lower second-conductivity-type carrier mobility than the drift region and the base region;
a gate trench portion provided from an upper surface of the semiconductor substrate to an inside of the semiconductor substrate, the gate trench portion being in contact with the base region;
a carrier passage region occupying at least a partial region between the accumulation region and the gate trench portion inside the semiconductor substrate, the carrier passage region having a higher second-conductivity-type carrier mobility than the accumulation region;
a mesa portion in contact with the gate trench portion; and
a dummy trench portion provided from the upper surface of the semiconductor substrate to the inside of the semiconductor substrate, wherein
the base region is provided within the mesa portion and extends downward beyond a lower end of the gate trench portion in the mesa portion,
in the mesa portion, the accumulation region is positioned lower than the lower end of the gate trench portion,
the base region is in contact with both of the dummy trench portion and the gate trench portion,
the dummy trench portion includes:
a dummy insulating film formed on a trench inner wall; and
a dummy conductive portion surrounded by the dummy insulating film,
at least a part of a bottom portion of the dummy trench portion does not have the dummy insulating film formed thereon, and
the dummy conductive portion is in contact with the semiconductor substrate at the bottom portion of the dummy trench portion.

10. The semiconductor device according to claim 1,
wherein the at least one gate trench portion is provided along a predetermined linear direction at the upper surface of the semiconductor substrate,
the semiconductor device further comprises:
a second-conductivity-type contact region formed above the base region inside the semiconductor substrate, and having a higher doping concentration than the base region,
the emitter region and the contact region are exposed alternately at the upper surface of the semiconductor substrate along the linear direction, and
the carrier passage region is also provided below the emitter region.

11. A semiconductor device comprising:
a semiconductor substrate including a first-conductivity-type drift region;
a second-conductivity-type base region provided above the drift region inside the semiconductor substrate;
an accumulation region provided between the drift region and a lower surface of the base region inside the semiconductor substrate, the accumulation region having a lower second-conductivity-type carrier mobility than the drift region and the base region;
a gate trench portion provided from an upper surface of the semiconductor substrate to an inside of the semiconductor substrate, the gate trench portion being in contact with the base region;
a carrier passage region occupying at least a partial region between the accumulation region and the gate trench portion inside the semiconductor substrate, the carrier passage region having a higher second-conductivity-type carrier mobility than the accumulation region;
a mesa portion in contact with the gate trench portion;
a first-conductivity-type emitter region formed above the base region inside the semiconductor substrate, and having a higher doping concentration than the drift region; and
a second-conductivity-type contact region formed above the base region inside the semiconductor substrate, and having a higher doping concentration than the base region, wherein
the base region is provided within the mesa portion and extends downward beyond a lower end of the gate trench portion in the mesa portion,
in the mesa portion, the accumulation region is positioned lower than the lower end of the gate trench portion,
the gate trench portion is provided along a predetermined linear direction at the upper surface of the semiconductor substrate,
the emitter region and the contact region are exposed alternately at the upper surface of the semiconductor substrate along the linear direction, and
the carrier passage region is also provided below the contact region.

12. The semiconductor device according to claim 1, comprising:
a transistor portion provided in the semiconductor substrate, and having a second-conductivity-type collector region in a region in direct contact with a lower surface of the semiconductor substrate; and
a diode portion provided in the semiconductor substrate, and having a first-conductivity-type cathode region in a region in direct contact with the lower surface of the semiconductor substrate,
wherein the transistor portion includes the drift region, the base region, the accumulation region, the at least one gate trench portion and the carrier passage region, and the diode portion includes:
the drift region;
the base region; and
a dummy trench portion provided from the upper surface of the semiconductor substrate to the inside of the semiconductor substrate.

13. The semiconductor device according to claim 12, wherein in the diode portion, no accumulation region is provided between the base region and the drift region.

14. The semiconductor device according to claim 1, wherein the accumulation region is separated from the base region in a depth direction of the semiconductor substrate.

15. A semiconductor device comprising:
a semiconductor substrate including a first-conductivity-type drift region;
a second-conductivity-type base region provided above the drift region inside the semiconductor substrate;
an accumulation region provided between the drift region and a lower surface of the base region inside the semiconductor substrate, the accumulation region having a lower second-conductivity-type carrier mobility than the drift region and the base region;
a gate trench portion provided from an upper surface of the semiconductor substrate to an inside of the semiconductor substrate, the gate trench portion being in contact with the base region;
a carrier passage region occupying at least a partial region between the accumulation region and the gate trench portion inside the semiconductor substrate, the carrier passage region having a higher second-conductivity-type carrier mobility than the accumulation region; and
a mesa portion in contact with the gate trench portion, wherein
the base region is provided within the mesa portion and extends downward beyond a lower end of the gate trench portion in the mesa portion,
in the mesa portion, the accumulation region is positioned lower than the lower end of the gate trench portion, and
the accumulation region is in contact with the base region and overlaps the entire base region in the mesa portion.

16. The semiconductor device according to claim 1, wherein
the accumulation region is provided below the mesa portion and overlaps the entire base region in the mesa portion.

* * * * *